US012813283B2

(12) United States Patent
Koyama et al.

(10) Patent No.: US 12,813,283 B2
(45) Date of Patent: Nov. 24, 2026

(54) HIGH-FREQUENCY CIRCUIT DEVICE AND DETECTION SYSTEM

(71) Applicant: CANON KABUSHIKI KAISHA, Tokyo (JP)

(72) Inventors: Yasushi Koyama, Kanagawa (JP); Takeaki Itsuji, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 933 days.

(21) Appl. No.: 18/079,978

(22) Filed: Dec. 13, 2022

(65) Prior Publication Data

US 2023/0207500 A1 Jun. 29, 2023

(30) Foreign Application Priority Data

Dec. 23, 2021 (JP) ................................ 2021-209603

(51) Int. Cl.
*H10W 44/20* (2026.01)
*H03B 5/12* (2006.01)
(Continued)

(52) U.S. Cl.
CPC ............ *H10W 44/20* (2026.01); *H03B 5/129* (2013.01); *H03B 5/20* (2013.01); *H03B 7/08* (2013.01);
(Continued)

(58) Field of Classification Search
CPC .......... H01Q 1/243; H01Q 1/38; H03B 5/129; H03B 5/20; H03B 7/08; H10W 42/00;
(Continued)

(56) References Cited

U.S. PATENT DOCUMENTS 6,400,019 B1 * 6/2002 Hirashima ........... H05K 3/3436 257/737
7,248,995 B2 7/2007 Itsuji
(Continued)

FOREIGN PATENT DOCUMENTS

| | | |
|---|---|---|
| JP | 2001-196856 A | 7/2001 |
| JP | 2011-061274 A | 3/2011 |
| JP | 2020-136910 A | 8/2020 |

OTHER PUBLICATIONS

May 26, 2023 Extended Search Report in European Patent Application No. 22 21 2862.1.
(Continued)

*Primary Examiner* — Brigitte A Paterson
(74) *Attorney, Agent, or Firm* — Venable LLP

(57) ABSTRACT

A high-frequency circuit device includes: a chip which includes a high-frequency element, a high-frequency circuit, a signal conductor, and a chip ground; a package substrate on which the chip is disposed, a shunt path which is constituted by a package signal conductor which is disposed on an upper surface of the package substrate and is electrically connected to the signal conductor, a package first ground which is electrically connected to the chip ground, and a shunt element which is electrically connected to the package signal conductor and the package first ground; and a package second ground which is disposed at least inside the base of the package substrate or on a back surface of the package substrate, wherein a part of the base, a part of the shunt path, and the package second ground constitute a capacitive structure.

15 Claims, 15 Drawing Sheets

A-A' CROSS-SECTIONAL VIEW

(51) Int. Cl.

| | |
|---|---|
| ***H03B 5/20*** | (2006.01) |
| ***H03B 7/08*** | (2006.01) |
| ***H10W 42/00*** | (2026.01) |
| ***H10W 70/60*** | (2026.01) |
| ***H10W 74/10*** | (2026.01) |
| ***H10W 90/00*** | (2026.01) |

(52) U.S. Cl.
CPC .......... *H10W 42/00* (2026.01); *H10W 70/60* (2026.01); *H10W 74/127* (2026.01); *H03B 2201/0208* (2013.01); *H10W 90/755* (2026.01)

(58) Field of Classification Search
CPC ... H10W 44/20; H10W 70/60; H10W 74/127; H10W 90/755
See application file for complete search history.

(56) References Cited

U.S. PATENT DOCUMENTS

| | | | | |
|---|---|---|---|---|
| 7,358,918 | B2 | 4/2008 | Itsuji | |
| 7,542,000 | B2 | 6/2009 | Itsuji | |
| 7,560,695 | B2 | 7/2009 | Kasai | |
| 7,570,216 | B2 | 8/2009 | Itsuji | |
| 7,633,299 | B2 | 12/2009 | Itsuji | |
| 7,745,791 | B2 | 6/2010 | Kasai | |
| 7,884,767 | B2 | 2/2011 | Itsuji | |
| 7,919,752 | B2 | 4/2011 | Itsuji | |
| 7,922,659 | B2 | 4/2011 | Itsuji | |
| 7,924,107 | B2 | 4/2011 | Koyama | |
| 8,003,961 | B2 | 8/2011 | Itsuji | |
| 8,129,683 | B2 | 3/2012 | Itsuji | |
| 8,207,501 | B2 | 6/2012 | Katagiri | |
| 8,344,324 | B2 | 1/2013 | Kasai | |
| 8,451,069 | B2 | 5/2013 | Sekiguchi | |
| 8,618,486 | B2 | 12/2013 | Itsuji | |
| 8,896,389 | B2 | 11/2014 | Koyama | |
| 9,184,697 | B2 | 11/2015 | Sekiguchi | |
| 9,391,428 | B2 | 7/2016 | Koyama | |
| 9,899,959 | B2 | 2/2018 | Feiginov | |
| 11,025,199 | B2 | 6/2021 | Kandori | |
| 11,442,338 | B2 | 9/2022 | Itsuji | |
| 2004/0075170 | A1* | 4/2004 | Degani ................. | H10W 44/20 257/723 |
| 2012/0051000 | A1* | 3/2012 | Laidig ................ | H05K 7/20409 361/736 |
| 2012/0119838 | A1 | 5/2012 | Koyama et al. | |
| 2015/0171523 | A1* | 6/2015 | Kamgaing ......... | H01Q 21/0093 343/893 |
| 2015/0364816 | A1* | 12/2015 | Murugan .............. | H10W 44/20 257/664 |
| 2016/0344353 | A1 | 11/2016 | Watts et al. | |
| 2019/0067788 | A1 | 2/2019 | Koyama | |
| 2020/0266762 | A1 | 8/2020 | Kandora et al. | |
| 2020/0296265 | A1 | 9/2020 | Itsuji | |
| 2020/0296266 | A1 | 9/2020 | Koyama | |
| 2021/0091722 | A1 | 3/2021 | Koyama | |
| 2021/0091743 | A1* | 3/2021 | Tsai ..................... | H03H 7/0115 |
| 2021/0313283 | A1* | 10/2021 | Wilson .................. | H10W 44/20 |
| 2021/0384866 | A1* | 12/2021 | Wilson .................. | H03F 1/0205 |
| 2022/0173515 | A1 | 6/2022 | Koyama | |

OTHER PUBLICATIONS

Jan. 2, 2025 Office Action in Taiwanese Patent Application No. 111145365 (with English translation).
Co-pending U.S. Appl. No. 18/115,054, filed Feb. 28, 2023.

* cited by examiner

TOP VIEW

A-A' CROSS-SECTIONAL VIEW

TOP VIEW

BACK SURFACE VIEW

A–A' CROSS-SECTIONAL VIEW

B–B' CROSS-SECTIONAL VIEW

HIGH-FREQUENCY CIRCUIT DEVICE AND DETECTION SYSTEM

BACKGROUND OF THE INVENTION

Field of the Invention

The present invention relates to a high-frequency circuit device and a detection system which handle an electromagnetic wave. In particular, the present invention relates to an antenna device which transmits or receives an electromagnetic wave.

Description of the Related Art

There is a high-frequency circuit device which handles an electromagnetic wave including at least a part of a frequency band from a millimeter wave to a terahertz wave (at least 30 GHz and not more than 30 THz) (hereinafter simply referred to as "terahertz wave"). As an example of the high-frequency circuit device, Japanese Patent Application Publication No. 2020-136910 discloses an oscillator in which a negative resistance element and a resonance circuit are integrated on a semiconductor chip.

The high-frequency circuit device in Japanese Patent Application Publication No. 2020-136910 uses a resonant tunneling diode (RTD) as the negative resistance element, and has a circuit which supplies a bias voltage to the negative resistance element (hereinafter simply referred to as "voltage bias circuit").

Japanese Patent Application Publication No. 2020-136910 discloses a technique in which, in order to suppress parasitic low-frequency oscillation of an electromagnetic wave other than the terahertz wave (hereinafter simply referred to as "parasitic oscillation"), a shunt element in which a resistance element and a capacitive element are connected in series is electrically connected in parallel to the voltage bias circuit, and the parasitic oscillation is thereby suppressed.

SUMMARY OF THE INVENTION

The present invention has been made in view of the above problem, and suppresses parasitic oscillation.

A first aspect of the present invention is a high-frequency circuit device including: a chip which includes a high-frequency element, a high-frequency circuit, a signal conductor, and a chip ground; and a package substrate which includes a base having an upper surface and a back surface on an opposite side of the upper surface, and on which the chip is disposed, the high-frequency circuit device further comprising: a shunt path which is constituted by a package signal conductor which is disposed on the upper surface of the package substrate and is electrically connected to the signal conductor, a package first ground which is electrically connected to the chip ground, and a shunt element which is electrically connected to the package signal conductor and the package first ground; and a package second ground which is disposed at least inside the base of the package substrate or on the back surface of the package substrate, wherein a part of the base, a part of the shunt path, and the package second ground constitute a capacitive structure.

Further features of the present invention will become apparent from the following description of exemplary embodiments with reference to the attached drawings.

DESCRIPTION OF THE EMBODIMENTS

With only an improvement in the layout of a resistance element and a capacitive element constituting a shunt element disposed on the surface of a circuit board, inductance caused by a physical distance becomes a restriction. Specifically, in the case where the shunt element is designed with a lumped constant circuit, it becomes difficult to control the inductance due to restrictions by an element size and a design rule of a substrate and, for example, the impedance increases at 10 MHz or higher. As a result, the possibility of occurrence of parasitic oscillation in a frequency range of not less than 10 MHz is increased.

From this, in a high-frequency circuit device aimed at a terahertz wave, it is desired to suppress an increase in the impedance of the circuit to suppress the parasitic oscillation in a frequency range in which it is difficult to perform control with the lumped constant circuit.

Hereinbelow, embodiments of the present invention will be described with reference to the drawings. Note that the present invention is not limited to the following embodiments.

First Embodiment

A high-frequency circuit device according to a first embodiment will be described by using FIGS. 1A and 1B to FIG. 4.

Figure 1A:
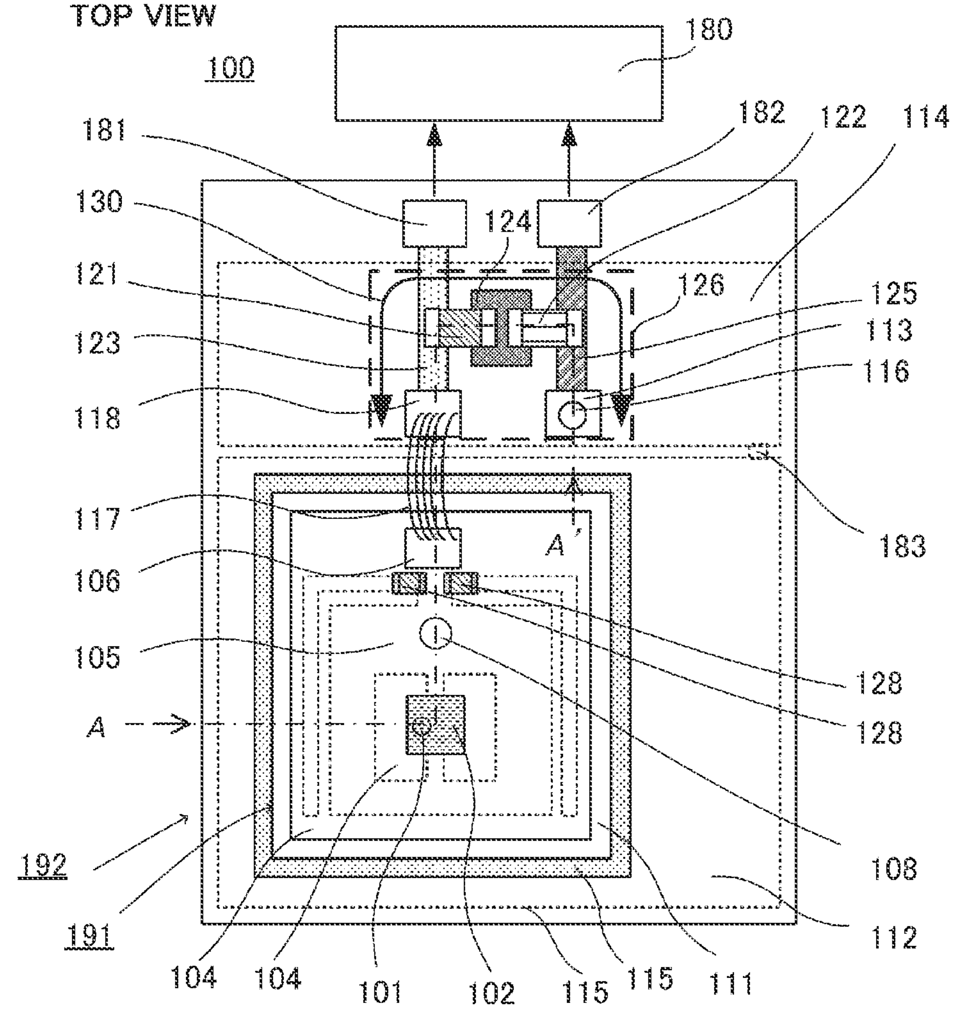
FIGS. 1A and 1B are a top view and a cross-sectional view of a high-frequency circuit device according to a first embodiment.
Figure 1B:
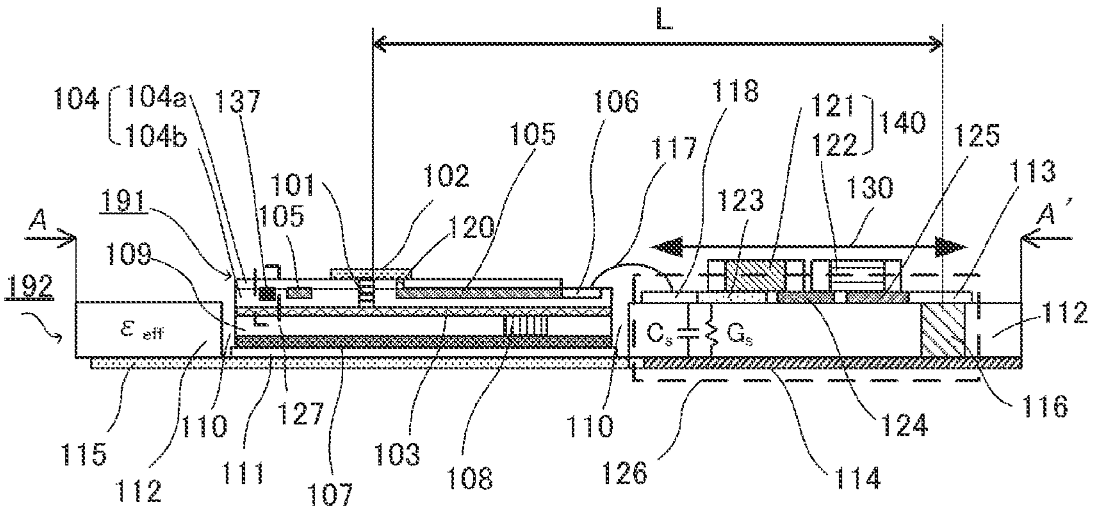

Each of FIGS. 1A and 1B is a view showing a schematic configuration of the high-frequency circuit device according to the present embodiment. FIG. 1A is a top view, and FIG. 1B is a cross-sectional view taken along the line A-A'.

A high-frequency circuit device 100 according to the present embodiment is constituted by a package 192, a chip 191 mounted on the package 192, and a voltage bias circuit 180 which drives the chip 191 via the package 192.

As shown in FIG. 1A, the rectangular chip 191 in which a high-frequency element 101 and a high-frequency circuit 102 accompanying the high-frequency element 101 are disposed is mounted on a package substrate 112 constituting the package 192.

The chip 191 is mounted in a cavity 110 provided in the package 192. The high-frequency element 101 is an active element which operates with a terahertz wave such as a transistor or a diode. The high-frequency circuit 102 is a circuit of a passive element aimed at the terahertz wave such as a filter or an antenna. Many high-frequency circuits 102 are constituted by distributed constant circuits. The terahertz wave is an electromagnetic wave including a frequency band which is at least a part of a frequency band from a millimeter wave to the terahertz wave (at least 30 GHz and not more than 30 THz) (hereinafter simply referred to as "terahertz wave").

Further, the chip 191 may have an in-chip shunt element for stabilizing operations of the high-frequency element 101 and the high-frequency circuit 102. For example, the in-chip shunt element is constituted by a chip resistance element 128 and a chip capacitive element 127. In addition, the chip 191 may include a chip signal pad (chip-side signal pad) 106 which applies a bias voltage to the chip 191 and a chip ground pad (not shown) which applies a ground voltage to the chip 191. Each of the chip signal pad 106 and the chip ground pad is formed of a conductive material. In the following description, it is assumed that pads, grounds, and patterns are formed mainly of a conductive material. The chip signal pad 106 and the chip ground pad are provided for electrical connection with an external circuit of the chip 191, and are provided for, e.g., supplying a predetermined voltage from the outside. In addition, the chip signal pad 106 and the chip ground pad can be provided for supplying a predetermined voltage to the external circuit. In the present embodiment, the predetermined voltage can be a ground voltage, a power supply voltage, and a voltage from the voltage bias circuit. The high-frequency element 101 and the high-frequency circuit 102 are disposed substantially at the center of the chip 191, and the chip capacitive element 127 described later is disposed adjacent thereto.

FIG. 1B is a cross-sectional view taken along the line A-A' of FIG. 1A. In addition to the components described thus far, the chip 191 has at least a dielectric layer 104, a chip signal pattern (chip signal conductor) 105, a chip ground 103, a semiconductor substrate 109, and a back surface chip ground 107. The dielectric layer 104 is constituted by a first dielectric layer 104*a* and a second dielectric layer 104*b*.

The chip signal pattern 105 is disposed between the first dielectric layer 104*a* and the second dielectric layer 104*b*. The high-frequency circuit 102 and the chip signal pattern 105 are electrically connected to each other via a signal through conductor 120.

The chip signal pattern 105 is electrically connected to the chip signal pad 106. Alternatively, a part of the chip signal pattern 105 serves as the chip signal pad 106.

The high-frequency element 101 is electrically connected to the high-frequency circuit 102 and the chip ground 103. The chip ground 103 is electrically connected to the back surface chip ground 107 via a chip ground through conductor 108. For example, a chip ground pad which is not shown is provided on the same surface as that of the chip signal pad 106. The chip ground pad which is not shown is electrically connected to a package-side ground pad. The chip ground pad which is not shown is electrically connected to the chip ground 103.

For example, the chip capacitive element 127 is constituted by a part of a chip shunt pattern (chip shunt conductor) 137 which is a conductor, a part of the second dielectric layer 104*b*, and a part of the chip ground 103. The chip capacitive element 127 is disposed adjacent to the high-frequency circuit 102. In addition, in FIG. 1A, the chip capacitive element 127 is disposed so as to surround the high-frequency circuit 102, whereby it is possible to increase a layout area of the chip capacitive element 127 on the chip 191, and secure a larger capacitance.

In addition, the chip capacitive element 127 is disposed so as to be divided into portions on sides of two opposing sides of the chip 191 (the right side and the left side of the chip 191 in FIG. 1A) such that the high-frequency circuit 102 is sandwiched by the chip capacitive element 127. With this, it is possible to dispose the chip resistance element 128, the chip signal pattern 105, and the chip signal pad 106 in a portion in which the chip capacitive element 127 is not disposed (the upper side of the chip 191 in FIG. 1A), and hence it is possible to reduce a chip size of the chip 191.

As the chip capacitive element 127, it is possible to use a metal-insulator-metal (MIM) capacitor in which an insulating layer is sandwiched between metal layers. It is possible to use a wiring layer in the chip 191 as the metal layer, and it is possible to use an insulating layer or a dielectric layer which forms the high-frequency circuit 102 as the insulating layer. According to the present embodiment, as shown in FIG. 1B, the chip ground 103 is used as one of electrodes of the MIM capacitor, and the chip ground 103 is connected to the back surface chip ground 107 which applies a ground voltage via the chip ground through conductor 108. The ground voltage may also be applied from a chip ground pad which is not shown. At this point, the chip ground pad is electrically connected to the chip ground 103 via the chip ground through conductor 108.

A part of the chip shunt pattern 137 is used as the other electrode of the MIM capacitor via the second dielectric layer 104*b*. In addition, the other electrode of the MIM capacitor may be connected to the chip resistance element 128 via wiring or a through conductor which is not shown. By constituting the MIM capacitor as the chip capacitive element 127, it is possible to form the capacitance in the chip 191 with a simple manufacturing process.

The configuration of the chip capacitive element 127 is not limited thereto. In addition to the configuration described above, it is possible to use a configuration in which a capacitance is formed on a substrate which is separate from the chip 191, and the capacitance is stuck to the surface or the back surface of the chip 191. According to this configuration, it is possible to provide a capacitive element having a larger capacitance.

As shown in FIGS. 1A and 1B, one terminal of the chip resistance element 128 is connected to the chip shunt pattern 137 which is one terminal of the chip capacitive element 127 via wiring and a through conductor which are not shown. The other terminal of the chip resistance element 128 is connected to the chip signal pad 106 via the chip signal pattern 105. The chip resistance element 128 and the chip capacitive element 127 are connected in series between the chip signal pattern 105 and the chip ground 103. The chip resistance element 128 is preferably disposed in the vicinity of the chip capacitive element 127 for easy connection with the chip capacitive element 127. Alternatively, the chip resistance element 128 may also be disposed so as to be overlapped on the chip capacitive element 127. The chip signal pattern 105 applies a bias voltage to the high-frequency circuit 102.

The chip resistance element 128 and the chip capacitive element 127 function as the shunt element for the high-frequency circuit 102. Specifically, the chip resistance element 128 and the chip capacitive element 127 which serve as the shunt element constitute a snubber circuit. In the present embodiment, while the chip resistance element 128 is connected to the side of the chip signal pad 106 and the chip capacitive element 127 is connected to the side of the chip ground 103, the connection relationship may be reversed. In FIGS. 1A and 1B, the number of pairs of the chip resistance element 128 and the chip capacitive element 127 is two, but the number of pairs thereof is not limited thereto. It is only required that, at the frequency of parasitic oscillation to be suppressed, a resistance component of the shunt element is smaller than an absolute value of a resistance component of the high-frequency element 101 constituting the high-frequency circuit 102.

In addition, the chip resistance element 128 may also be constituted by using a wiring resistance. With this, it is possible to reduce the number of components used in the chip 191 and implement a reduction in the size of the chip 191. Further, the shunt element may also be constituted by one of the chip resistance element 128 and the chip capacitive element 127. In the case where the shunt element includes the chip capacitive element 127, it becomes possible to suppress not only the parasitic oscillation but also power consumption by cutting a direct current by utilizing frequency characteristics of an impedance.

The high-frequency element 101 is an element which operates in a terahertz wave region. The material of the semiconductor substrate 109 is selected according to the structure of the high-frequency element 101. For example, it is possible to use a silicon substrate or an InP substrate which is a compound semiconductor as the semiconductor substrate 109. In addition, the first dielectric layer 104*a* and the second dielectric layer 104*b* which constitute the dielectric layer 104 are preferably formed of a substance having a low loss to the terahertz wave. For example, materials such as benzocyclobutene (BCB), silicon oxide, and silicon nitride can be used. The types of the materials are not limited thereto.

In FIGS. 1A and 1B, the package 192 includes a resistance element 121 and a capacitive element 122 which constitute a shunt element 140. In addition, the package 192 includes a package-side signal pad 118 for connection with the chip-side signal pad 106 of the chip 191, and a package-side ground pad 113 for connection with a chip-side ground pad (not shown) of the chip 191.

The package-side signal pad 118 and the package-side ground pad 113 are provided for electrical connection with an external circuit. Each of the package-side signal pad 118 and the package-side ground pad 113 is constituted by a conductive material. Herein, the external circuit is the chip 191.

The package 192 also includes a bias connection terminal 181 to which a bias voltage is supplied from the voltage bias circuit 180, and a ground connection terminal 182 which provides a ground voltage. For reducing the size of the package 192, it is preferable to use surface mount devices (SMD) as the resistance element 121 and the capacitive element 122. Wiring disposed in the package 192 also has a resistance value, and hence a wiring resistance included in the shunt element 140 may be used as the resistance element 121. With this, it is possible to reduce the number of components used in the package 192 and implement a reduction in the size of the package 192.

The voltage bias circuit 180 is connected via the bias connection terminal 181 and the ground connection terminal 182 from the outside of the package 192. Note that, instead of this configuration, the voltage bias circuit 180 may be disposed on the package 192 and may also be disposed on the chip 191.

The chip-side signal pad 106 of the chip 191 and the package-side signal pad 118 of the package 192 are connected by a bonding wire 117. In order to reduce the inductance of the bonding wire 117, it is preferable to dispose the chip-side signal pad 106 and the package-side signal pad 118 such that the chip-side signal pad 106 and the package-side signal pad 118 are positioned close to each other, and reduce the length of the bonding wire 117. In order to shorten the bonding wire 117, it is appropriate to dispose the chip-side signal pad 106 at an end portion of the chip 191. In addition, it is appropriate to dispose the chip-side signal pad 106 and the package-side signal pad 118 such that the chip-side signal pad 106 and the package-side signal pad 118 face each other with a side of the chip 191 interposed therebetween. It is also possible to control the inductance of the bonding wire 117 with the number of wires and the diameter of the wire. At the frequency of the terahertz wave or the parasitic oscillation to be suppressed, the resistance component of the bonding wire 117 is designed to be sufficiently smaller than the absolute value of the resistance component of the high-frequency element 101 constituting the high-frequency circuit 102.

In FIGS. 1A and 1B, the package 192 has a package ground 115 on the back surface side of the package 192. The package ground 115 has the same potential as that of each of the package-side ground pad 113 and the ground connection terminal 182. The back surface chip ground 107 of the chip 191 is electrically connected to the package ground 115 via a conductive layer 111. As the conductive layer 111, it is possible to use a low-resistance die bonding material. With this connection, the package 192 supplies a ground voltage to the chip 191. Note that, with regard to the supply of the ground voltage from the package 192, the ground voltage may be supplied to a chip-side ground pad which is not shown via the package-side ground pad 113.

One terminal of the resistance element 121 is connected to one terminal of the capacitive element 122 via a package intermediate wiring pattern (package intermediate wiring conductor) 124 which is a conductor. That is, the resistance element 121 and the capacitive element 122 are connected in series. Consequently, it is preferable to dispose the resistance element 121 and the capacitive element 122 such that the resistance element 121 and the capacitive element 122 are positioned close to each other. More preferably, one terminal of the resistance element 121 is disposed adjacent to one terminal of the capacitive element 122. With this, it is possible to reduce the length of the package intermediate wiring pattern 124 and reduce the inductance.

The other terminal of the resistance element 121 is connected to the package-side signal pad 118 and the bias connection terminal 181 via a package signal pattern (package signal conductor) 123 which is a conductor. In addition, the other terminal of the capacitive element 122 is connected to the package-side ground pad 113 and the ground connection terminal 182 via a package first ground 125. A direction in which one terminal and the other terminal of the resistance element 121 and one terminal and the other terminal of the capacitive element 122 are aligned is preferably made identical to a direction in which the package-side signal pad 118 and the package-side ground pad 113 are aligned. With such a layout, it is possible to shorten wiring for connection, and reduce the inductance.

The shunt element 140 is constituted by the resistance element 121 and the capacitive element 122 which are connected in series, and functions as the shunt element for the chip 191 including the high-frequency circuit 102. Specifically, the resistance element 121 and the capacitive element 122 which serve as the shunt element constitute a snubber circuit. In the present embodiment, the resistance element 121 is connected to the side of the package signal pattern 123, and the capacitive element 122 is connected to the side of the package first ground 125. Note that this connection relationship may be reversed. In addition, a plurality of the shunt elements 140 may be used. At the frequency of the parasitic oscillation to be suppressed, the resistance component of the shunt element 140 is preferably smaller than the absolute value of the resistance component of the high-frequency element 101 constituting the high-frequency circuit 102 of the chip 191. In addition, the shunt element 140 may be constituted by one of the resistance element 121 and the capacitive element 122. In the case where the shunt element 140 includes the capacitive element 122, it becomes possible to suppress not only the parasitic oscillation but also power consumption by cutting a direct current by utilizing frequency characteristics of the impedance.

In the package substrate 112 constituting the package 192, it is possible to use a base used in a printed circuit board such as a glass composite substrate, a glass epoxy substrate, or a fluorine substrate. In addition, in the package substrate 112, it is possible to use a base used in a ceramic circuit board such as an aluminum oxide ($Al_2O_3$) substrate, an aluminum nitride (AlN) substrate, or a low temperature co-fired ceramics (LTCC) substrate. Preferably, a base having a low loss to the terahertz wave is used in the package substrate 112.

With regard to a positional relationship of individual components of the high-frequency circuit device 100, the shunt element of the chip 191 is preferably disposed between the high-frequency circuit 102 and the voltage bias circuit 180. In addition, the shunt element 140 of the package 192 is preferably disposed between the shunt element of the chip 191 and the voltage bias circuit 180. The detail of a device which uses a plurality of shunt elements is disclosed in, e.g., Japanese Patent Application Publication No. 2020-136910. Herein, a plurality of the shunt elements are used. With this, it is possible to suppress the parasitic oscillation in a wide frequency band.

According to our studies, in the case where the shunt element is designed with a lumped constant circuit, a frequency at which control of the inductance becomes difficult due to restrictions by an element size and a design rule of a substrate has been determined. For example, the impedance of the circuit is expected to be increased at a frequency of not less than 10 MHz, and hence it is desirable to improve stability of the circuit at this frequency (not less than 10 MHz).

To cope with this, in the present embodiment, the high-frequency circuit device 100 has the following configuration. As has been described thus far, the chip 191 has at least the high-frequency element 101, the high-frequency circuit 102, the chip signal pattern 105, and the chip ground 103. The package 192 includes the base having the upper surface and the back surface which faces the upper surface (on the opposite side of the upper surface), and has at least the package substrate 112 on which the chip 191 is disposed. In addition, as shown in FIG. 1B, the package 192 is characterized in that a capacitive structure 126 is provided in a thickness direction of the package substrate 112 in the vicinity of a side on which the package 192 is connected to the chip 191.

The capacitive structure 126 will be described. In FIG. 1B, the capacitive structure 126 is constituted by a part of the base of the package substrate 112, a part of a shunt path 130, and a part of a package second ground 114.

The shunt path 130 is defined as a path including the package signal pattern 123, the resistance element 121 constituting the shunt element 140, the package intermediate wiring pattern 124, the capacitive element 122 constituting the shunt element 140, and the package first ground 125. The path of the shunt path 130 can also be defined as a path through which current passes. The shunt path 130 is disposed on the upper surface of the package substrate 112. The package signal pattern 123 is electrically connected to the chip signal pattern 105. The package first ground 125 is electrically connected to the chip ground 103. The shunt element 140 is electrically connected to the package signal pattern 123 and the package first ground 125.

The package second ground 114 is a conductor disposed on the back surface side of the package substrate 112 constituting the package 192. Herein, the package second ground 114 is electrically connected to the package ground 115 via a ground connection pattern (ground connection conductor) 183. The ground connection pattern 183 is a thin line pattern of a conductor. For example, the thin line pattern of the conductor can be viewed as an inductor, and an impedance increases as a frequency increases. In other words, it is possible to adjust the impedance at a desired frequency. By utilizing this characteristic, in any band from the frequency of the parasitic oscillation to the frequency of the terahertz wave, the package ground 115 and the package second ground 114 are electrically separated from each other by the ground connection pattern 183. The ground connection pattern 183 may also be a filter constituted by a distributed constant circuit.

In addition, the package second ground 114 is electrically connected to the package first ground 125 via a package ground through conductor 116 inside the package substrate 112. With the shape of the package ground through conductor 116, it is possible to impart an inductor component and a capacitive component to the package ground through conductor 116. In other words, it is possible to adjust the impedance at a desired frequency. By utilizing this characteristic, for example, in any band from the frequency of the parasitic oscillation to the frequency of the terahertz wave, the package first ground 125 and the package second ground 114 are electrically separated from each other. In a frequency range serving as a target, by electrically separating the individual grounds, it is possible to prevent mixing of an unnecessary signal via the ground, and hence the operation of the high-frequency circuit device 100 is stabilized. By configuring a part of the base of the package substrate 112 such that the conductor of the shunt path 130 and the package second ground 114 are sandwiched, as shown in FIG. 1B, it is possible to provide a capacitance Cs and an admittance Gs in the vicinity of a connection portion between the chip 191 and the package 192. In the present embodiment, this capacitive structure 126 is used as the shunt element, and the capacitance obtained by the shunt element is used for suppressing the parasitic oscillation.

In each of the through conductors described above such as the chip ground through conductor 108, the package ground through conductor 116, and the signal through conductor 120, after a through hole is formed in a member, an insulating film for electrical separation is formed on an inner wall of the through hole. Subsequently, by filling the through hole with copper or the like which has low electrical resistance and allows easy electrode formation by electroplating or the like, each of these through conductors is formed. In addition, these conductors may also be smoothed by using chemical mechanical polishing (CMP) processing or the like. For example, after the through conductor is formed, a pad may be formed so as to be electrically connected to external wiring.

Figure 2A:
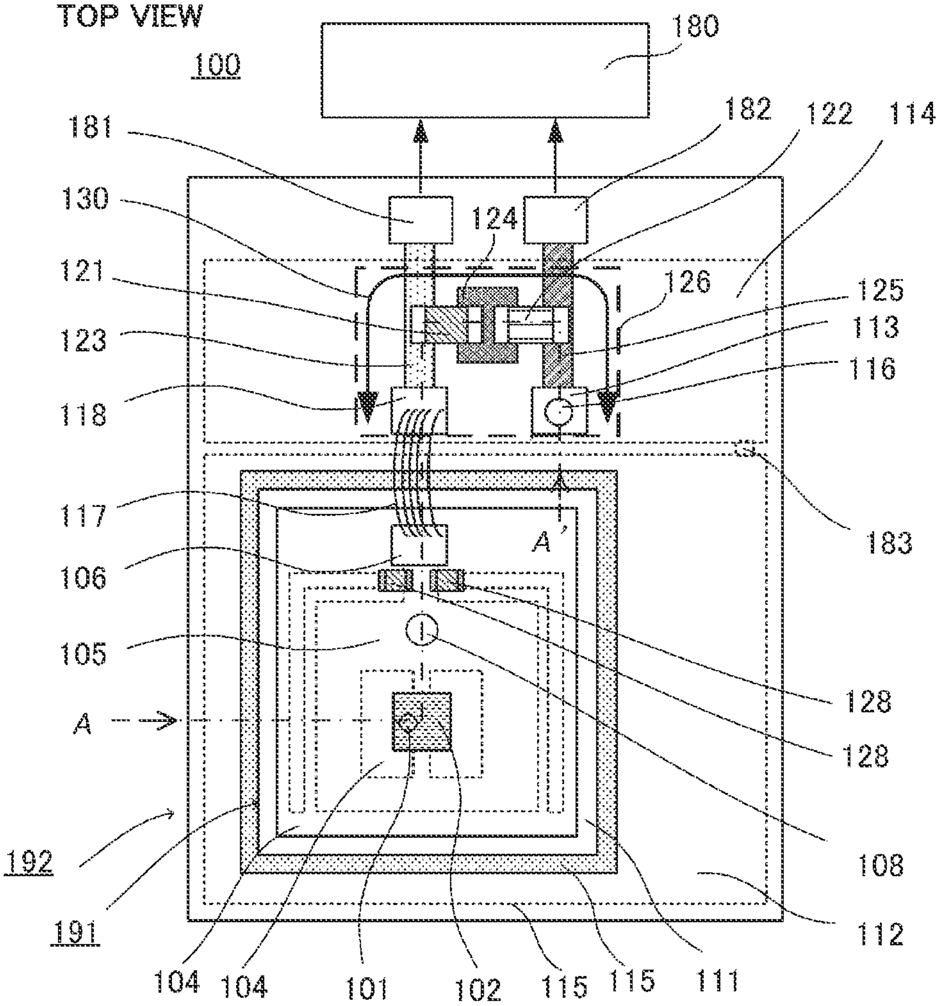
FIGS. 2A and 2B are a top view and a cross-sectional view of the high-frequency circuit device according to a modification of the first embodiment.
Figure 2B:
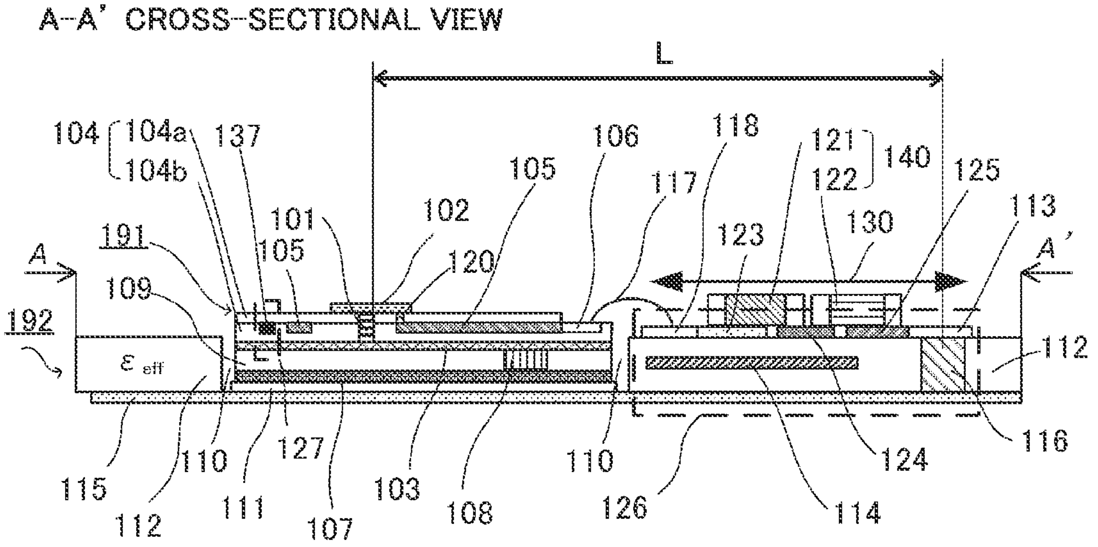

It is possible to adjust the capacitance obtained by the capacitive structure 126 with an interval between the conductor of the shunt path 130 and the package second ground 114. For example, as shown in FIG. 2B, the package second ground 114 may be disposed inside the base of the package substrate 112. In FIG. 2B, the package second ground 114 is electrically connected to the package first ground 125 and the package ground 115 via the package ground through conductor 116. At this point, in any band from the frequency of the parasitic oscillation to the frequency of the terahertz wave, the package first ground 125, the package second ground 114, and the package ground 115 are electrically separated from each other in the thickness direction of the base of the package substrate 112. By disposing the package second ground 114 inside the base of the package substrate 112, flexibility of the capacitance adjustment of the capacitive structure 126 is increased. As a result, controllability of parasitic oscillation suppression is improved.

According to FIGS. 1A and 1B and FIGS. 2A and 2B, when viewed from the shunt path 130, a part of the shunt path 130, a part of the package first ground 125, and a part of the package second ground 114 are disposed so as to overlap each other. Consequently, it can be said that the capacitive structure 126 serving as the shunt element and the shunt element 140 constituted by the SMD component are disposed so as to overlap each other when viewed from the shunt path 130. Thus, by disposing a plurality of the shunt elements such that the shunt elements overlap each other, it is possible to reduce the length of wiring required by the circuit, and hence the suppression of the parasitic oscillation is facilitated. In addition, it is possible to dispose a plurality of the shunt elements such that the shunt elements overlap each other, and hence a reduction in the size of the entire circuit is facilitated, and it is possible to contribute to a reduction in the size of the package 192.

In addition, in FIGS. 1A and 1B and FIGS. 2A and 2B, in order to use the capacitive structure 126 as the shunt element, a distance L between the high-frequency element 101 and the package ground through conductor 116 preferably satisfies a relationship of $\lambda_{sig} \leq L \leq \lambda_{para}$ between a wavelength $\lambda_{sig}$ and a wavelength $\lambda_{para}$. Herein, the wavelength $\lambda_{sig}$ is an effective wavelength of a high-frequency signal of the high-frequency circuit 102, and the wavelength $\lambda_{para}$ is an effective wavelength of the parasitic oscillation which occurs in the shunt path 130. The distance L is, e.g., a length along a current path from an end of the high-frequency element 101 (an end of an array antenna; an end of an element close from a pad of an electrode) to the center of the package ground through conductor 116. Note that the effective wavelength of the parasitic oscillation is long, and hence, even when an error is present at a position of a start point or an end point of the distance L, an influence of the error is small.

Figure 3:
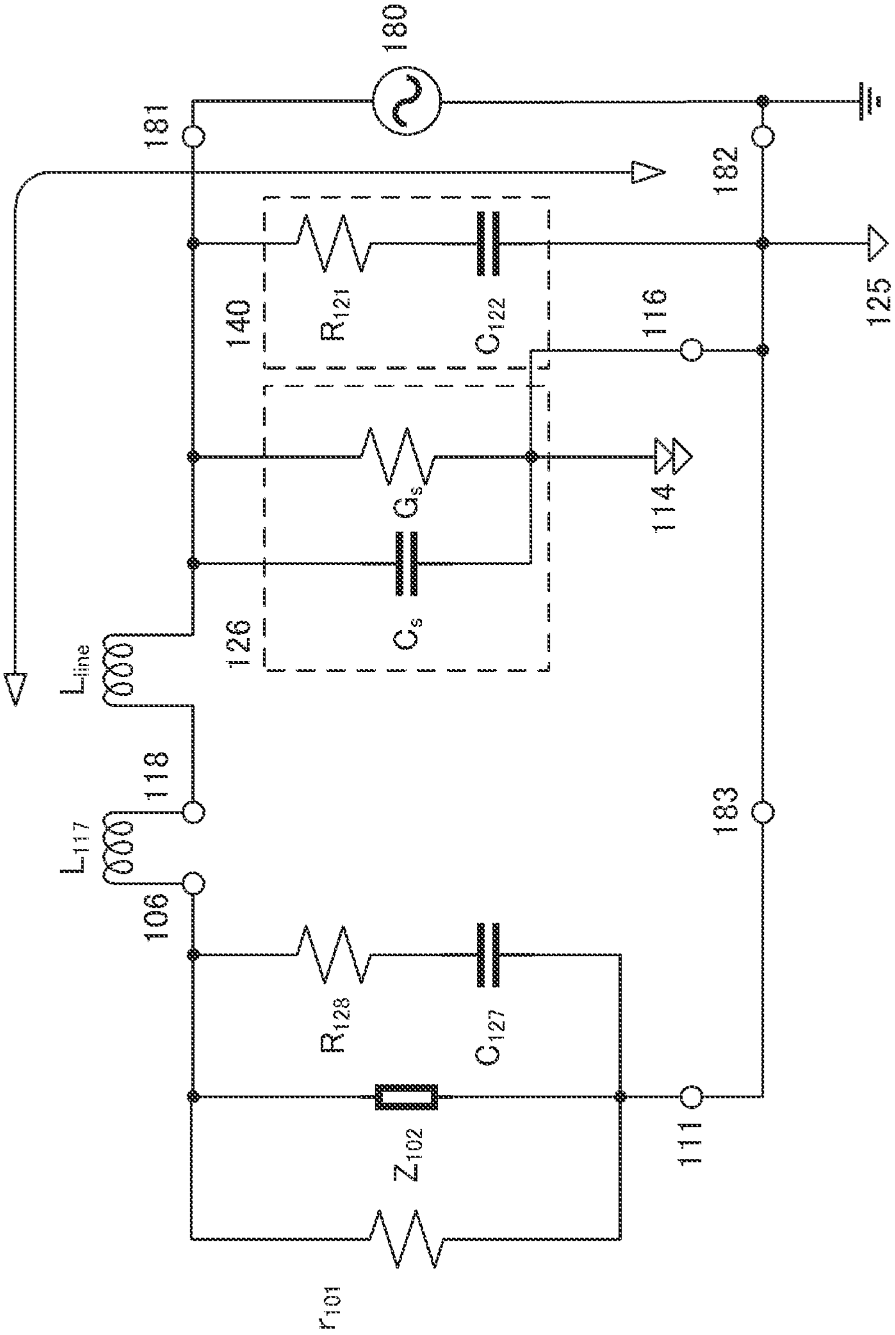
FIG. 3 is an equivalent circuit diagram of the high-frequency circuit device according to the first embodiment.

FIG. 3 is a view showing an example of an equivalent circuit of the present embodiment. Specifically, the example of the equivalent circuit of each of FIGS. 1A and 1B is shown. In FIG. 3, $r_{101}$ denotes an absolute value of a negative resistance of the high-frequency element 101. In general, when a combined resistance of circuits connected in parallel to the high-frequency element 101 is denoted by R, in the case where a relationship of $r_{101}<R$ is satisfied, the circuit in a subsequent stage becomes unstable, and the parasitic oscillation easily occurs. The chip 191 is connected to the package 192 via the chip-side signal pad 106 and the conductive layer 111. $Z_{102}$ denotes a combined impedance of the high-frequency circuit 102. $R_{128}$ denotes a resistance of the chip resistance element 128. $C_{127}$ denotes a capacitance (electrostatic capacity) of the chip capacitive element 127. $R_{128}$ and $C_{127}$ constitute the snubber circuit which is the shunt element, suppress the influence of the circuit of the package 192 when viewed from the high-frequency circuit 102, and suppress, e.g., the parasitic oscillation on the side of a high frequency of several GHz to several hundred GHz.

The chip-side signal pad 106 of the chip 191 and the package-side signal pad 118 of the package 192 are connected to each other via the bonding wire 117. $L_{117}$ denotes an inductance of the bonding wire 117.

With regard to the package 192, $L_{line}$ expresses an influence of circuits or wiring provided in the shunt path 130 as an inductance. The wiring in the shunt path 130 denotes the package signal pattern 123, the package intermediate wiring pattern 124, and the package first ground 125. As has been described thus far, in the present embodiment, the capacitive structure 126 is constituted by a part of the base of the package substrate 112, a part of the shunt path 130, and the package second ground 114. Cs denotes a capacitance of the capacitive structure 126. Gs denotes an admittance which is the reciprocal of the resistance component of the capacitive structure 126.

The package second ground 114 which regulates a reference potential of the capacitive structure 126 is electrically connected to the package first ground 125 via the package ground through conductor 116. In addition, the package first ground 125 is electrically connected to the conductive layer 111 of the chip 191 via the ground connection pattern 183. While the potentials of these grounds are identical to each other in terms of direct current, the grounds are separated from each other in terms of alternating current depending on frequency, and unnecessary noises or signals are thereby prevented from being combined with the circuit via the grounds. Cs and Gs of the capacitive structure 126 constitute the shunt element. Cs and Gs of the capacitive structure 126 suppress mainly an influence of the inductor $L_{line}$ caused by the circuit or the wiring in the shunt path 130, and adjust the impedance of the shunt path 130 to a low impedance (an impedance of not more than a predetermined value) in a desired frequency range. This frequency range is, e.g., a range of at least 10 MHz and not more than 10 GHz (medium frequency range), and the parasitic oscillation in the medium frequency range is suppressed by adjusting the impedance of the shunt path 130 to the low impedance in the medium frequency range.

The shunt path 130 has the shunt element 140 constituted by the SMD component. $R_{121}$ denotes a resistance of the resistance element 121 constituting the shunt element 140. $C_{122}$ denotes a capacitance of the capacitive element 122 constituting the shunt element 140. $R_{121}$ and $C_{122}$ constitute the snubber circuit which is the shunt element, and suppress an influence of the voltage bias circuit 180 when viewed from the circuit of the package 192. The snubber circuit constituted by $R_{121}$ and $C_{122}$ suppresses the parasitic oscillation on the side of a low frequency of, e.g., not more than several hundred MHz. The package 192 and the voltage bias circuit 180 are connected to the bias connection terminal 181 via the ground connection terminal 182.

Figure 4:
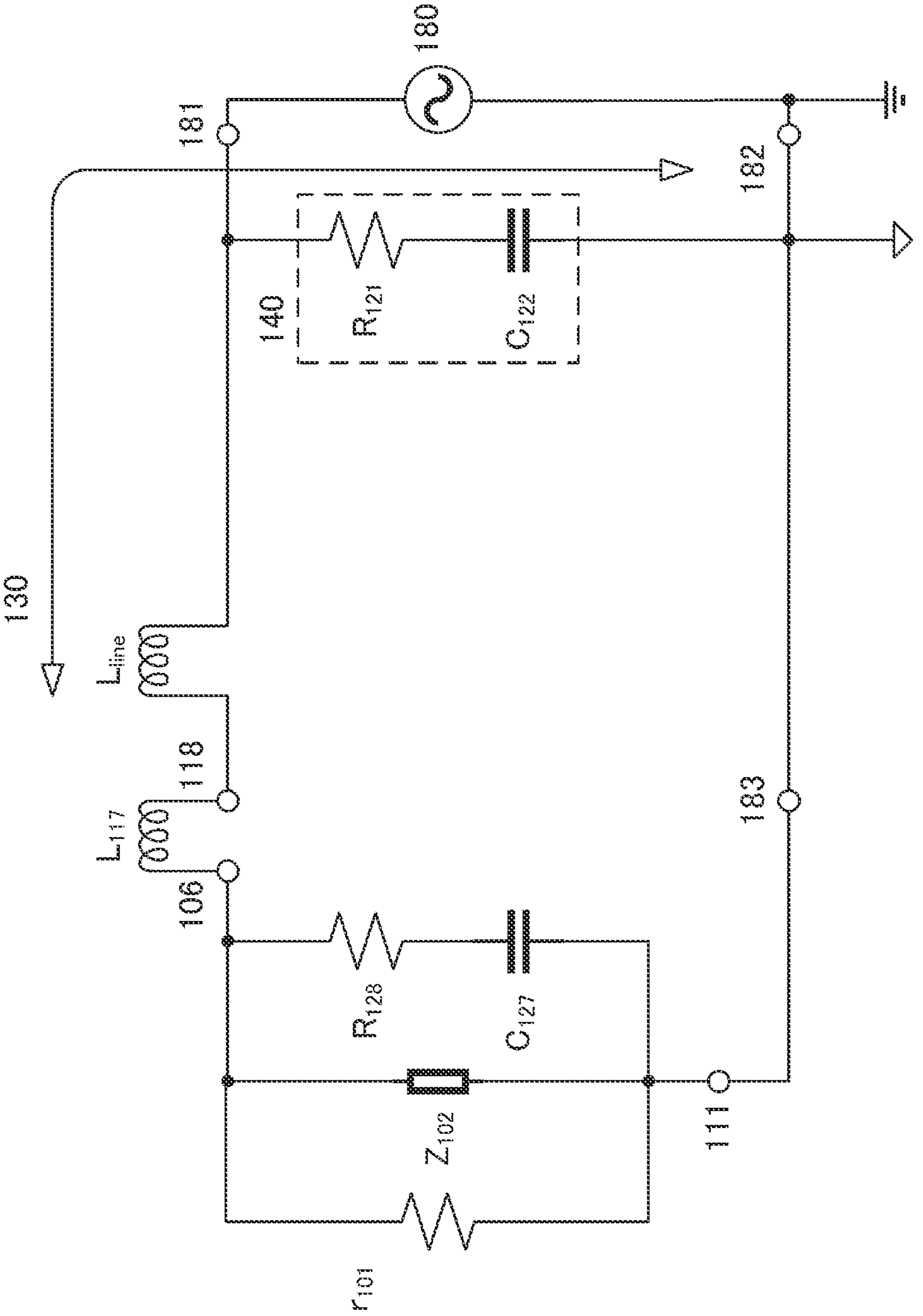
FIG. 4 is an equivalent circuit diagram of the high-frequency circuit device having a conventional configuration.

FIG. 4 is a view showing an example of an equivalent circuit having a conventional configuration (e.g., Japanese Patent Application Publication No. 2020-136910). As is clear from a comparison between FIG. 3 and FIG. 4, the conventional configuration does not have the shunt element by the capacitive structure 126, and hence it is difficult to perform impedance adjustment in the medium frequency range. In addition, depending on the circuit configuration and the circuit layout, there is a possibility that the parasitic oscillation caused by the inductor $L_{line}$ may occur.

Thus, by using a plurality of the shunt elements, it becomes easy to suppress the parasitic oscillation in a wide frequency band. In particular, with the capacitive structure 126, it is possible to suppress the parasitic oscillation in the medium frequency band which has been difficult to suppress, and hence the circuit is further stabilized.

Second Embodiment

Figure 5A:
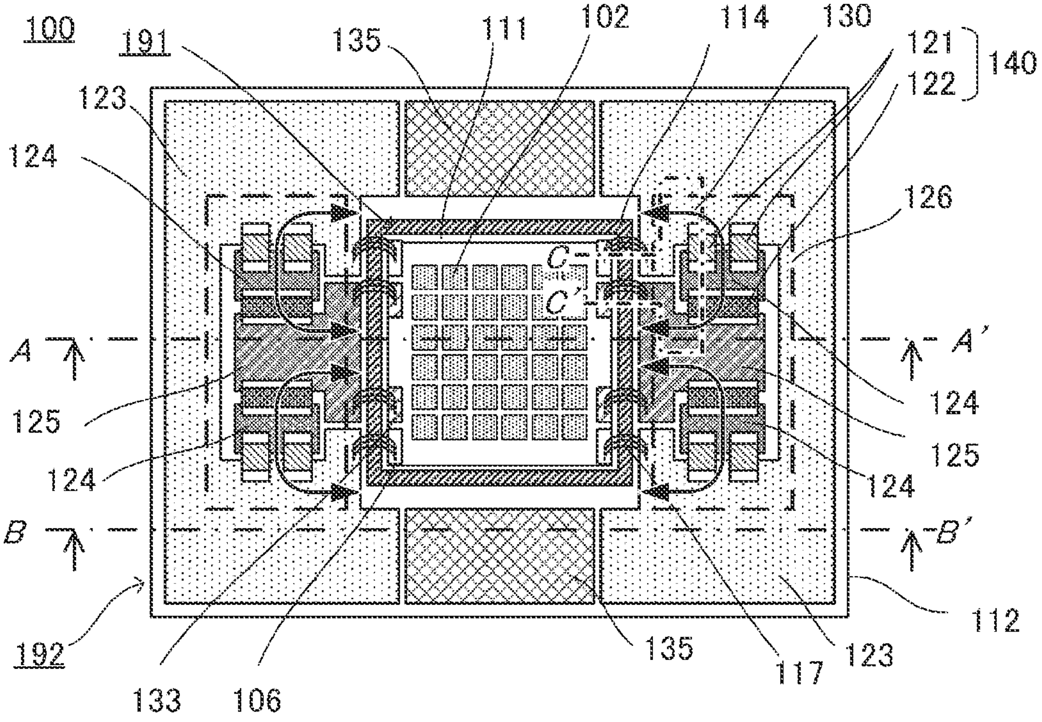
FIGS. 5A and 5B are a top view and a back surface view of the high-frequency circuit device according to a second embodiment.
Figure 5B:
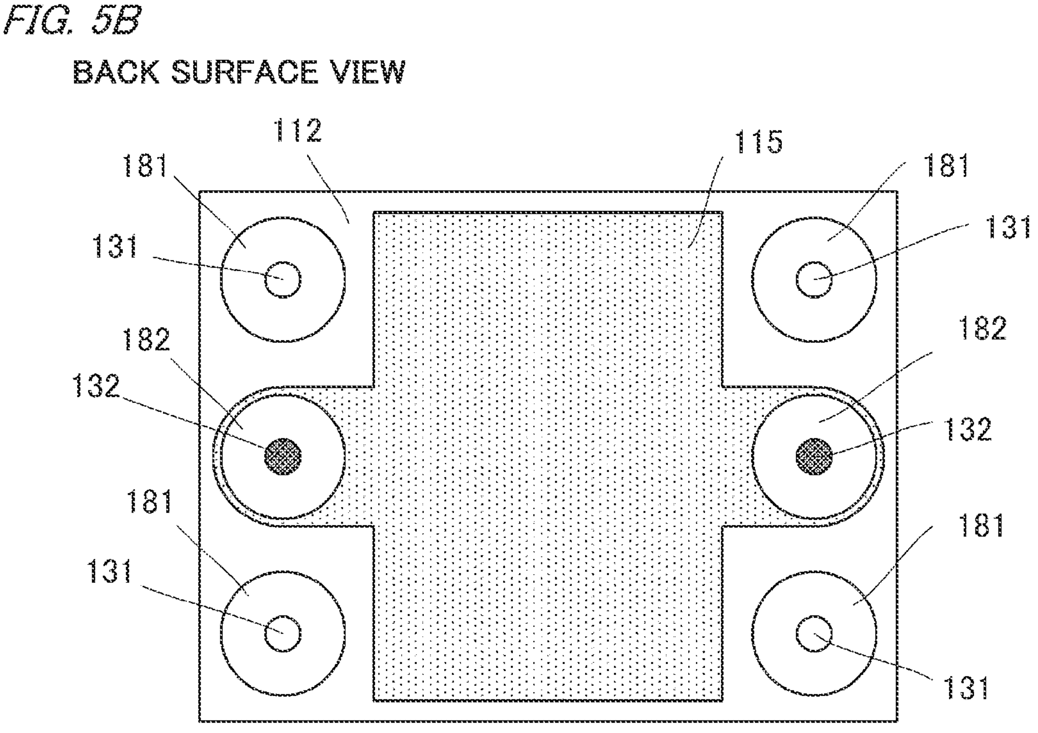
Figure 6A:
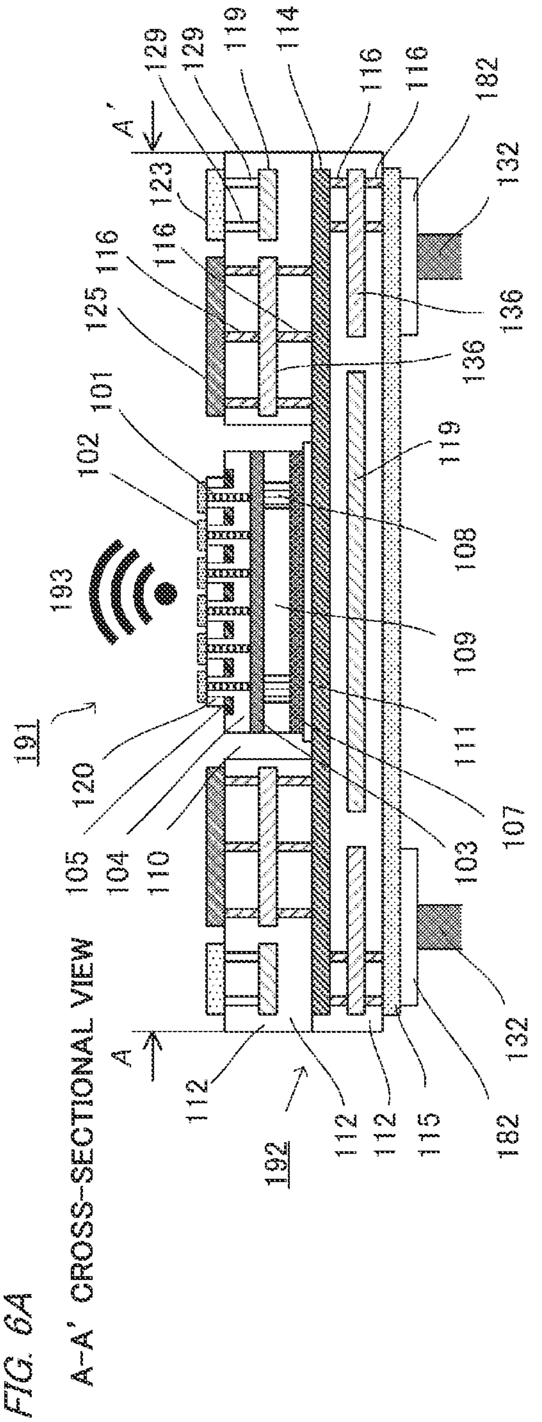
FIGS. 6A and 6B are cross-sectional views of the high-frequency circuit device according to the second embodiment.
Figure 6B:
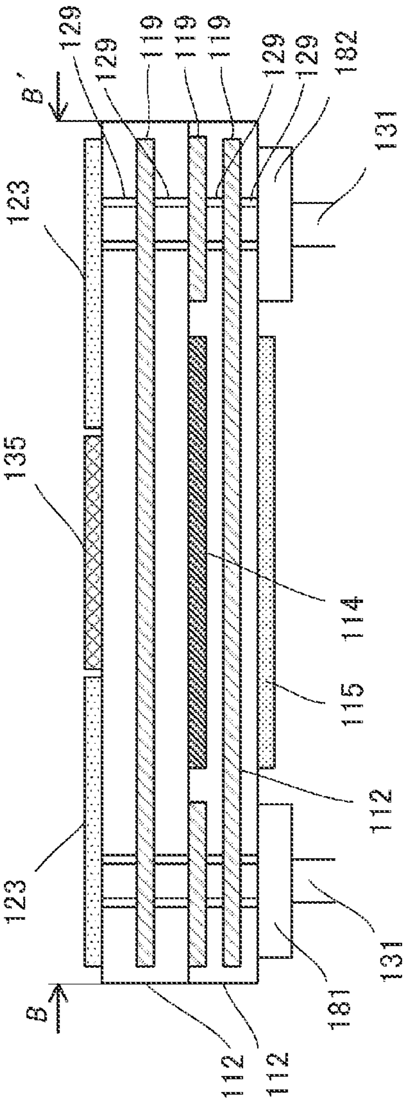
Figure 7:
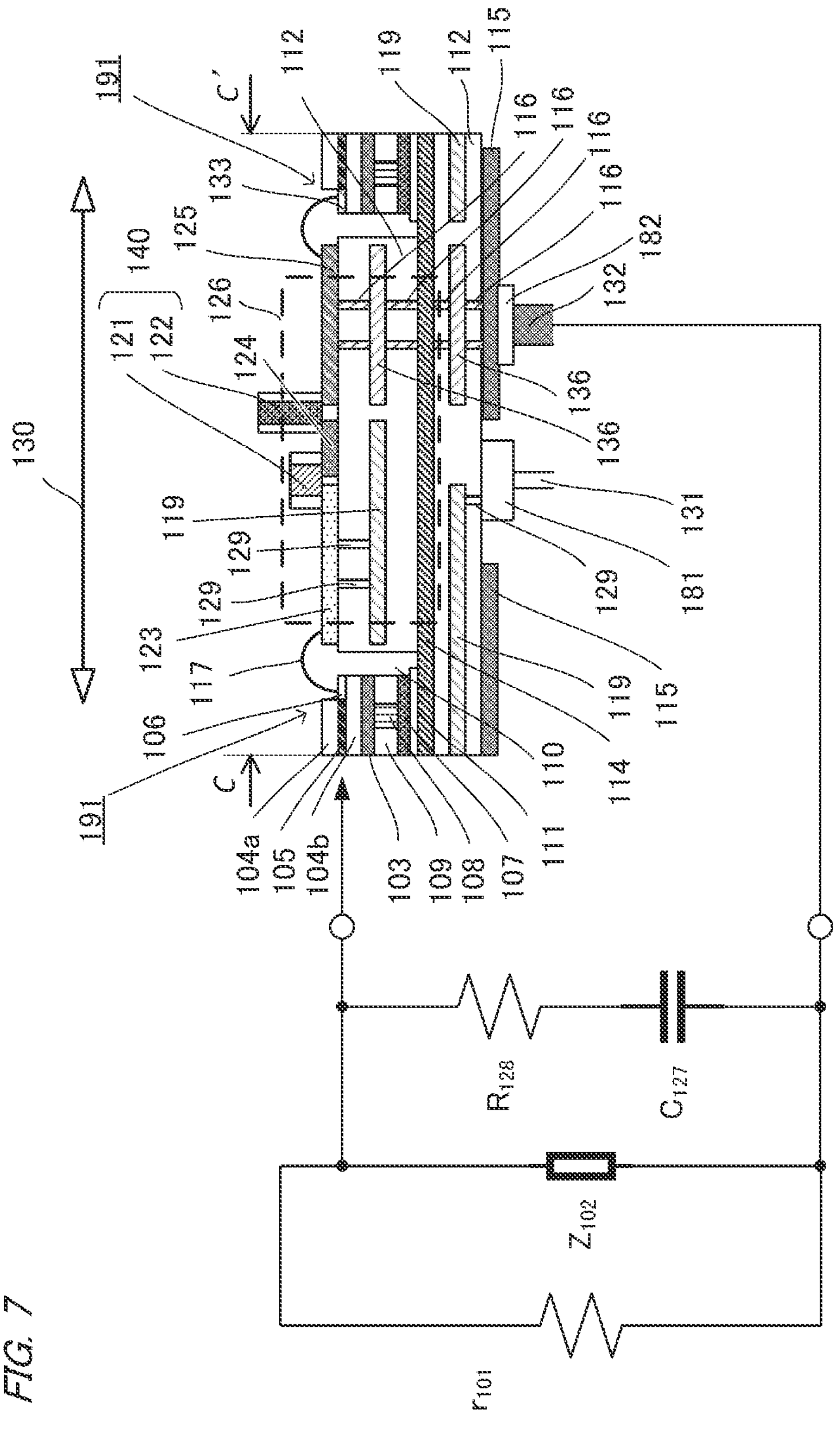
FIG. 7 is a cross-sectional view of the high-frequency circuit device according to the second embodiment.

The high-frequency circuit device according to a second embodiment will be described with reference to FIGS. 5A and 5B to FIG. 7. Note that the description of portions which are common to the above description will be omitted. FIGS. 5A and 5B to FIG. 7 are views each showing a schematic configuration of the high-frequency circuit device 100 according to the present embodiment. FIG. 5A is a top view. FIG. 5B is a back surface view. FIG. 6A is a cross-sectional view taken along the line A-A' of FIG. 5A. FIG. 6B is a cross-sectional view taken along the line B-B' of FIG. 5A. FIG. 7 is a cross-sectional view taken along the line C-C' of FIG. 5A. As the high-frequency circuit device according to the present embodiment, an example of an antenna device for transmitting or receiving a terahertz wave 193 is shown.

The chip 191 in FIG. 6A is different from the first embodiment in the following configuration. The high-frequency element 101 is a negative resistance element having a gain to the terahertz wave 193. The high-frequency circuit 102 is an antenna for transmitting or receiving the terahertz wave 193. The antenna can be viewed as a resonance circuit, and also plays the role of an impedance converter with the air. In particular, in the present embodiment, the chip 191 has a plurality of the high-frequency elements 101, and one antenna is connected to one high-frequency element 101. In the present embodiment, a plurality of the antennas are also referred to as an array antenna. In the present embodiment, power combining of the terahertz wave 193 is performed by an antenna array. As shown in FIG. 5A, the number of chip-side signal pads 106 and the number of chip-side ground pads 133 are different from those in the first embodiment, and four chip-side signal pads 106 and four chip-side ground pads 133 are disposed. The chip-side signal pad 106 is electrically connected to the package signal pattern 123 of the package 192 via the bonding wire 117. The chip-side ground pad 133 is connected to the package first ground 125 of the package 192 via the bonding wire 117.

The detail of each of the high-frequency element 101 and the high-frequency circuit 102 will be described. As the array antenna which corresponds to the high-frequency circuits 102, twenty to forty antennas are disposed. FIG. 5A shows an example in which thirty-six antennas are disposed in a matrix. Note that the arrangement layout is not limited thereto. In the antenna array used for the purpose of power combining, an interval between the individual antennas is usually set to be not more than a wavelength which is converted to a wavelength of an oscillating electromagnetic wave in vacuum, or set to be an integral multiple of the wavelength, or more preferably set to be not more than a half of the wavelength. In the present embodiment, the antennas are disposed such that the interval between the antennas is not more than a half of the wavelength of the terahertz wave 193 which is a transmitted electromagnetic wave.

In the antenna array, a resonance circuit is constituted. The resonance circuit controls an oscillation frequency with a microstrip resonator constituted by a metal layer (corresponds to the high-frequency circuit 102) which forms a part of the antenna, the dielectric layer 104, and the chip ground 103 which is a conductor forming a part of the antenna. The antenna is constituted by the resonance circuit and a negative resistance element which is the high-frequency element 101. A bias voltage line which is not shown is connected to the metal layer via the signal through conductor 120, and a bias voltage is applied to the negative resistance element. The bias voltage line is connected to the chip-side signal pad 106. The negative resistance element generates an electromagnetic wave gain for maintaining oscillation. The individual antennas need to oscillate in synchronization with the same phase, and are designed to have a frequency close to an oscillation frequency $\omega_0$. The shapes of the individual antennas each including a half-wavelength resonator are preferably similar to each other. The present embodiment shows an example of a patch-shaped antenna, but the shape of the antenna is not limited thereto. It is preferable to use the negative resistance elements having shapes and characteristics which are similar to each other. A configuration in which the antenna also serves as a resonance circuit for oscillating the electromagnetic wave and the negative resistance element for supplying power to the resonance circuit is integrated is also referred to as an active antenna. In particular, the configuration of the present embodiment corresponds to an active antenna array in which a plurality of active antennas are disposed in a matrix.

Each active antenna has a microstrip line (not shown) for synchronization with the same phase, and adjacent active antennas are coupled with the microstrip line. In the present embodiment, this microstrip line is also referred to as a coupling line for causing the individual active antennas to oscillate in synchronization with the same phase.

It is preferable to select a length from one end to the other end of the coupling line which is not shown such that an electrical length of the oscillation frequency $\omega_0$ after the synchronization is $2\pi$. The electrical length of $2\pi$ is a length corresponding to an effective oscillation wavelength $\lambda_0$ converted with an effective dielectric constant in a surrounding structure. $2\pi$ is selected as the electrical length in order to cause the adjacent active antennas to oscillate in synchronization with the same phase. In the case where the adjacent active antennas are synchronized with the opposite phase, the electrical length may be $\pi$ or $3\pi$. Even when the length of the coupling line is not exactly 2π, it is possible to synchronize the adjacent active antennas. Although depending on the size of coupling between elements formed by the coupling line, typically, the electrical length of about 2π±10% is in a permissible range. Note that this permissible range is wider than that of a form in which the adjacent active antennas are coupled in space without using the coupling line. Note that the electrical length of the coupling line can be easily confirmed with an electromagnetic field simulator or the like.

A part of an oscillation output of one active antenna is input to the other active antenna positioned adjacent to the one active antenna with substantially the same phase via the coupling line. In addition, a part of an oscillation output of the other active antenna is input to the one active antenna positioned adjacent to the other active antenna with substantially the same phase via the coupling line. In the active antenna array of the present embodiment, the coupling line is introduced in order to implement a phenomenon of mutual injection locking between the adjacent active antennas.

As an example of the coupling line of the present embodiment, the coupling line which is not shown is capacitively coupled to a metal layer which is a part of a resonance structure. For example, the coupling line which is not shown holds an insulating layer between the metal layer and the coupling line to constitute a metal-insulator-metal (MIM) region and forms a capacitance via the insulating layer, and hence the coupling line is in a DC-open state. With this, in the band of the oscillation frequency $\omega_0$, the size of the coupling between the active antennas is the same as that of direct coupling, and it is possible to secure a large size. Further, in a low frequency range which is lower than $\omega_0$, the size of the coupling is reduced, and hence it is possible to secure isolation between the active antennas. Furthermore, in the low frequency range which is lower than $\omega_0$, the coupling line which is an open-ended microstrip line is a capacitive element. When the side of the high-frequency circuit 102 which is the metal layer having an antenna pattern is viewed from the high-frequency element 101 which is the negative resistance element, the coupling line is the capacitive element, and can function as, e.g., the shunt element. Consequently, a resonance frequency which is a matter of concern in the low frequency range is not generated. Accordingly, it becomes possible to suppress the parasitic oscillation in the low frequency range.

Combined power is increased and high directivity can also be obtained by disposing the active antennas described above in a matrix and coupling the adjacent active antennas under the above condition of the coupling line in the chip 191, which is preferable.

In FIGS. 5A and 7, the high-frequency circuits 102 which are a plurality of metal layers are connected in common inside the chip 191 via a strip conductor which is not shown, and are connected to the chip-side signal pad 106 to which a bias voltage is applied. In addition, the chip ground 103 is connected to the chip-side ground pad 133 to which a ground voltage is applied inside the chip 191. With this configuration, when voltage is applied to each of the chip-side signal pad 106 and the chip-side ground pad 133, the bias voltage is applied to each end of the high-frequency element 101 which is the negative resistance element.

As the negative resistance element, it is possible to use a resonant tunneling diode (RTD) which lattice-matches an InP substrate. Note that the negative resistance element is not limited to the resonant tunneling diode, and an Esaki diode or a Gunn diode may also be used. The resonant tunneling diode is configured to have, e.g., a multiple quantum well structure with InGaAs/InAlAs and InGaAs/AlAs on an InP substrate, and an electrical contact layer of n-InGaAs. As the multiple quantum well structure, for example, a triple barrier structure is used. More specifically, the multiple quantum well structure is constituted by a semiconductor multilayer film structure of AlAs (1.3 nm)/InGaAs (7.6 nm)/InAlAs (2.6 nm)/InGaAs (5.6 nm)/AlAs (1.3 nm). Among them, InGaAs is a well layer, and lattice-matching InAlAs and lattice-mismatching AlAs are barrier layers. These layers are undoped layers which are not doped with carriers intentionally. The multiple quantum well structure described above is held between the electrical contact layers of n-InGaAs each having an electron concentration of $2\times10^{18}$ $cm^{-3}$. In current-voltage (I/V) characteristics of the structure between the electrical contact layers, a peak current density is 280 $kA/cm^2$, and a range from about 0.7 V to about 0.9 V serves as a negative resistance region. In the case where the configuration of the diode adopts a mesa structure having a diameter of 2 μm, a peak current value of 10 mA and a negative resistance value of −20 Ω are obtained. When consideration is given to a reactance by the junction capacitance of the resonant tunnel diode having a diameter of 2 μm connected to a lower portion of the antenna pattern constituted by the metal layer, the oscillation frequency is about 0.3 to 0.6 THz.

In general, at the frequency of the parasitic oscillation to be suppressed, when the impedance of the circuit including a line when viewed from the negative resistance element is not more than ten times the absolute value of a negative differential resistance (e.g., $r_{101}$ in FIG. 3 or FIG. 4), the magnitude of a loss caused by the line cannot be ignored with respect to a gain of the negative resistance element. In other words, it is necessary to supply power to the circuit from the negative resistance element to compensate for lost power, and hence power contributing to oscillation becomes relatively small, and it becomes impossible to maintain the oscillation of the parasitic oscillation. The impedance of the circuit including the line is preferably equal to $r_{101}$, and more preferably has a value less than $r_{101}$. As an example, in a case where the size of the chip 191 is set to a size of three mm square to four mm square, it is possible to dispose twenty to forty antennas as the high-frequency circuits 102, and the combined resistance value of the negative resistance of the high-frequency element 101 is no larger than 1Ω, i.e., not more than 1Ω. Accordingly, in the frequency range serving as a target, when circuit design of the package 192 including the shunt element is performed with this value used as a target, it is possible to perform the suppression of the parasitic oscillation. For example, by setting the impedance of the package signal pattern 123 to 1Ω or less, the suppression of the parasitic oscillation is facilitated. Herein, the predetermined value is, e.g., 1Ω.

Next, the package 192 will be described with reference to FIGS. 5A and 5B to FIG. 7. The package 192 is different from the first embodiment in the following configuration.

The outer dimensions of the package 192 are about 10×8 mm, and the thickness of the package substrate 112 is about 1 mm. The package substrate 112 is an aluminum nitride substrate. With regard to the cavity 110 which accommodates the chip 191 provided on the package substrate 112, the package second ground 114 is disposed on a bottom surface of the cavity 110. In addition, in this configuration, the back surface chip ground 107 and the package second ground 114 are electrically connected to each other on the bottom surface of the cavity 110.

In FIG. 5A, the package 192 has four shunt paths 130, and the resistance element 121 and the capacitive element 122 which serve as the shunt element 140 are disposed along each shunt path 130. Two resistance elements 121 are disposed in parallel. With this, four shunt elements 140 are connected in parallel to the high-frequency element 101 serving as the negative resistance element, and it is possible to reduce the combined impedance of the shunt elements 140. Consequently, the suppression of the parasitic oscillation is facilitated, and the circuit is stabilized. The number of shunt paths 130 is not limited thereto.

The package 192 has a package floating wiring pattern (package floating wiring conductor) 135 which is a conductor. The package floating wiring pattern is in a state in which the potential of the package floating wiring pattern is not determined alone, i.e., the package floating wiring pattern is in an electrically floating state. The package floating wiring pattern 135 also serves as backup wiring and, for example, when the number of types of the control signal of the chip 191 is increased, the package floating wiring pattern 135 is used as a terminal for connection with an external circuit. Alternatively, the package floating wiring pattern 135 is space for expanding the circuit inside the package 192. Alternatively, the package floating wiring pattern 135 may also be used as a place for managing the lot number of the package 192.

In FIG. 5B, in the package 192, the bias connection terminal 181 and the ground connection terminal 182 are disposed on a back surface of the package 192. For example, similarly to common SMD components, it is possible to mount the package 192 in an external circuit with the bias connection terminal 181 and the ground connection terminal 182. The bias connection terminal 181 may have a signal pin 131 which is a stick-like conductor. The ground connection terminal 182 may have a ground pin 132 which is a stick-like conductor. In this case, it is possible to handle the package 192 as a dual inline package (DIP) package, and hence connection with the external circuit is facilitated. The forms of these connection terminals can be appropriately changed according to connection specifications of the external circuit. With these connection forms, for example, it becomes easy to manage the impedance of a connection portion with the voltage bias circuit 180, and hence the circuit can be expected to be stabilized.

FIG. 6A is a cross-sectional view taken along the line A-A' of FIG. 5A, and FIG. 6B is a cross-sectional view taken along the line B-B' of FIG. 5A. The package 192 of the present embodiment is different from the first embodiment in that the package 192 has a package inner layer signal pattern (package inner layer signal conductor) 119 and a package inner layer ground 136 which are provided as inner layers in the package substrate 112. For example, the package inner layer signal pattern 119 is disposed at a position at which a part of the package signal pattern 123 overlaps the package inner layer signal pattern 119 when viewed from the package signal pattern 123. Similarly, the package inner layer ground 136 is disposed at a position at which a part of the package first ground 125 overlaps the package inner layer ground 136 when viewed from the package first ground 125. In addition, in a cross section perpendicular to the upper surface of the package substrate 112 or in a direction perpendicular thereto, at least a part of the package inner layer signal pattern 119 is disposed at a position at which the part of the package inner layer signal pattern 119 overlaps at least a part of the package signal pattern 123. Similarly, at least a part of the package inner layer ground 136 is disposed at a position at which the part of the package inner layer ground 136 overlaps at least a part of the package first ground 125. In addition, in plan view, at least a part of the package inner layer signal pattern 119 is disposed at a position at which the part of the package inner layer signal pattern 119 overlaps at least a part of the package signal pattern 123. At least a part of the package inner layer ground 136 is disposed at a position at which the part of the package inner layer ground 136 overlaps at least a part of the package first ground 125. Herein, it is assumed that the plan view denotes, e.g., a view in which individual components are projected onto the package substrate 112 in a vertical direction.

As shown in FIG. 6B, the package inner layer signal pattern 119 is connected to the package signal pattern 123 and the ground connection terminal 182 via a package signal through conductor 129. The package inner layer ground 136 is connected to the package first ground 125, the package second ground 114, the package ground 115, and the ground connection terminal 182 via the package ground through conductor 116. For example, by disposing the package inner layer ground 136 below the package first ground 125, it is possible to reduce the impedance of the ground layer, and the ground in the circuit is strengthened. Consequently, the circuit is stabilized. In addition, a configuration is adopted in which, below the chip 191, the package inner layer signal pattern 119 is held between the package second ground 114 and the package ground 115 which have the same potential. With this, it is possible to prevent an unnecessary signal noise transmitted in the package inner layer signal pattern 119 from being combined with the chip 191. Consequently, the circuit is stabilized.

FIG. 7 is a cross-sectional view taken along the line C-C' of FIG. 5A, and is a cross-sectional view of the capacitive structure 126 along the shunt path 130. The chip signal pattern 105 and the package signal pattern 123 are electrically connected to each other via the bonding wire 117. The capacitive structure 126 is different from the first embodiment in that the capacitive structure 126 has the package inner layer signal pattern 119. The package inner layer signal pattern 119 is disposed inside the base of the package substrate 112 at a position at which a part of the package signal pattern 123 overlaps the package inner layer signal pattern 119 when viewed from the package signal pattern 123 (in a direction perpendicular to the upper surface of the package substrate 112). In addition, in plan view, at least a part of the package inner layer signal pattern 119 is disposed at a position at which the part of the package inner layer signal pattern 119 overlaps at least a part of the package signal pattern 123. By arranging the signal patterns in parallel, it is possible to reduce the impedance of wiring and facilitate the suppression of the parasitic oscillation. The package signal pattern 123 and the package inner layer signal pattern 119 may be appropriately disposed so as to overlap each other around, e.g., the shunt path 130.

Figure 8:
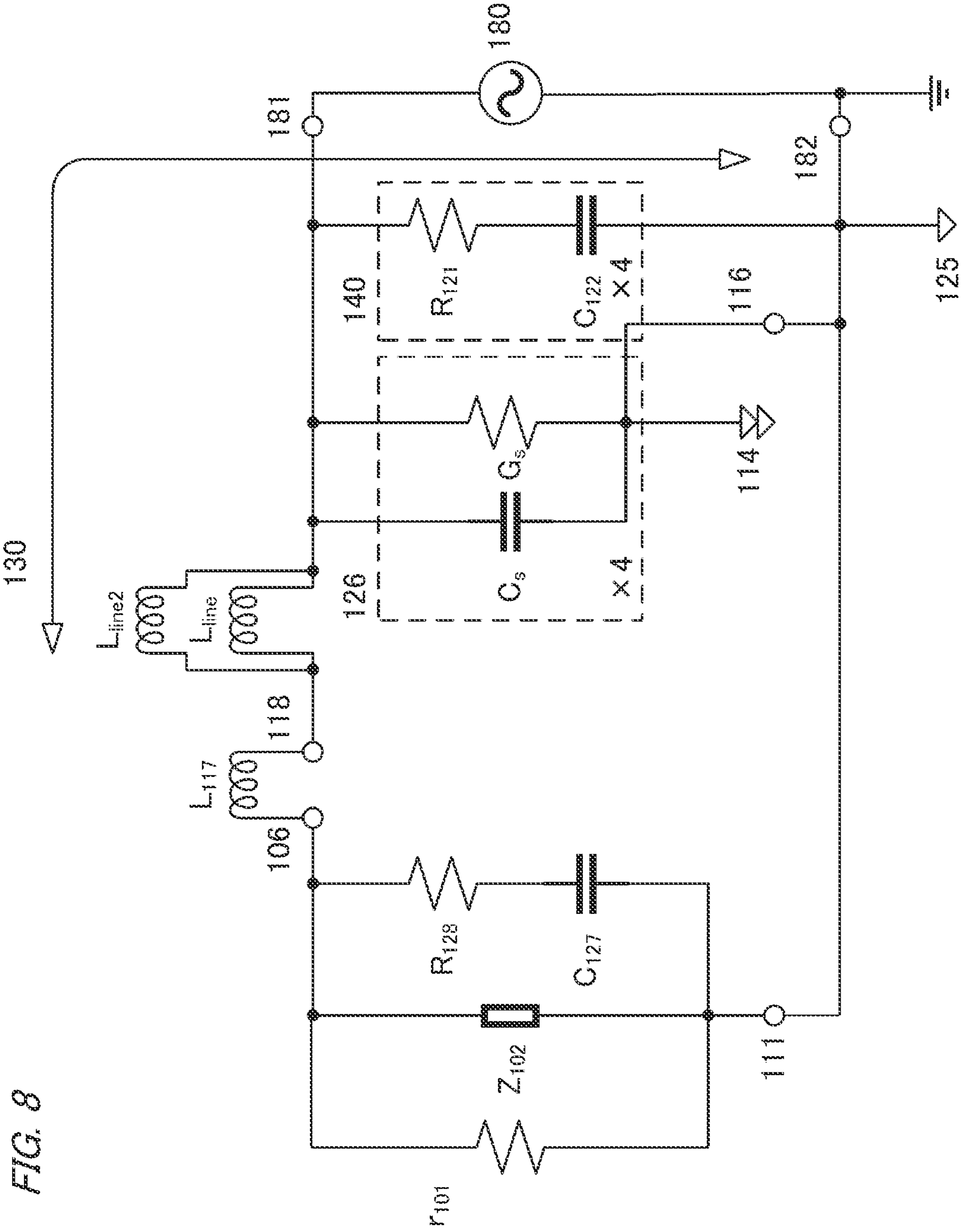
FIG. 8 is an equivalent circuit diagram of the high-frequency circuit device according to the second embodiment.

FIG. 8 is an example of an equivalent circuit diagram of the present embodiment. Unlike the equivalent circuit in FIG. 3, in the equivalent circuit diagram in FIG. 8, with regard to the shunt path 130, an inductor $L_{line2}$ of the circuit of an inner layer including the package inner layer signal pattern 119 is connected in parallel to the inductor $L_{line}$ of the circuit of an upper layer including the package signal pattern 123. With this, it is possible to decrease the inductors of the entire circuit. In addition, by having a plurality of the capacitive structures 126 and a plurality of the shunt elements 140, it is possible to decrease the inductors of the entire circuit. Accordingly, the suppression of the parasitic oscillation is facilitated, and it is possible to implement the stabilization of the circuit.

Figure 9A:
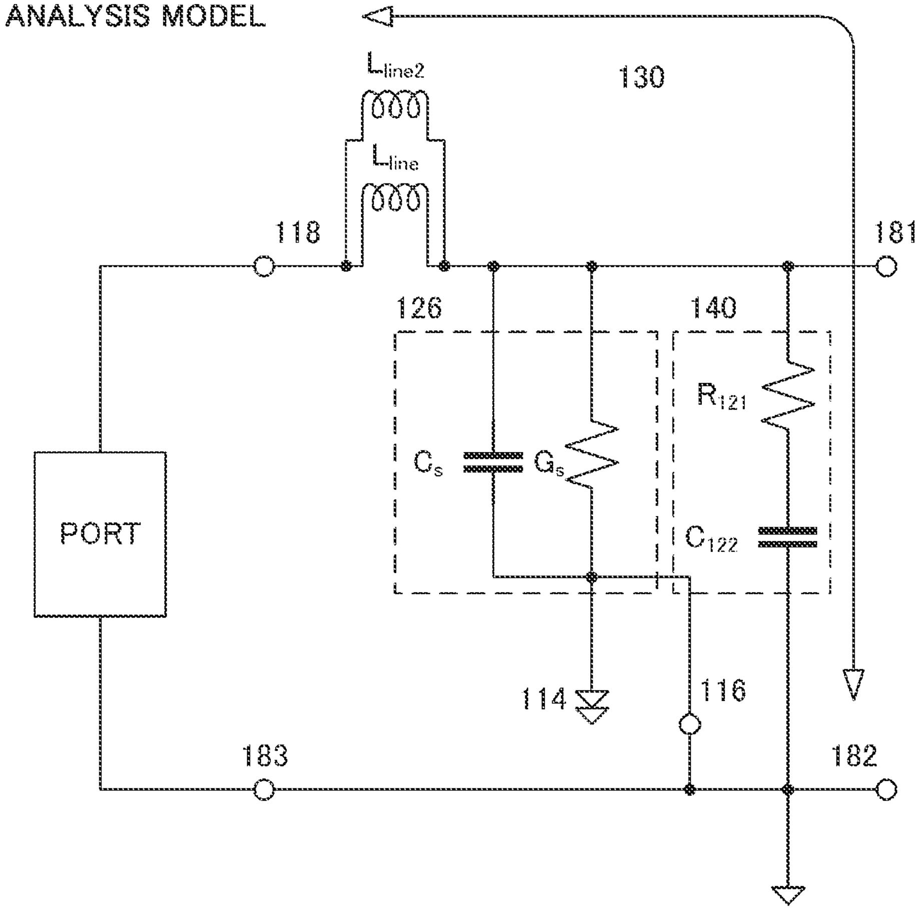
FIGS. 9A and 9B show analysis examples of the high-frequency circuit device according to the second embodiment.
Figure 9B:
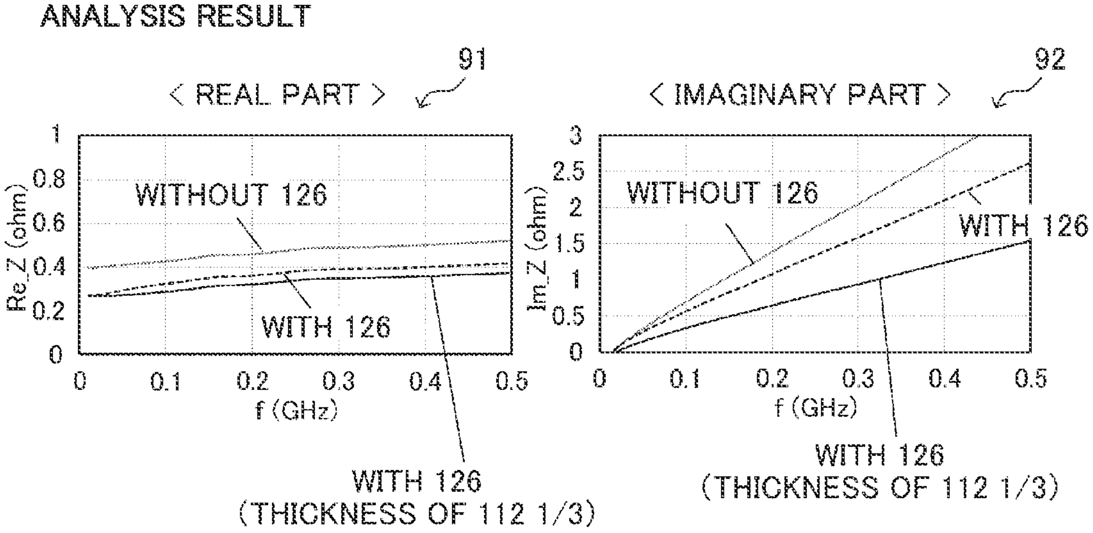

FIGS. 9A and 9B show examples of analysis of the impedance of the package 192 of the present embodiment. FIG. 9A is an analysis model. In order to analyze the impedance when viewed from the side of the chip 191, a port for analysis is provided at the position of the chip 191. In addition, the voltage bias circuit 180 is in a disconnected state, and the bias connection terminal 181 and the ground connection terminal 182 are in an open state.

FIG. 9B is a graph of an analysis result, and a real part of the impedance is plotted in a left graph 91 and an imaginary part of the impedance is plotted in a right graph 92. The horizontal axis indicates frequency, and the vertical axis indicates impedance. Herein, results of presence or absence of the capacitive structure 126 and a difference in the thickness of the base which is a part of the package substrate 112 constituting the capacitive structure 126 are plotted. According to the analysis, it can be seen that values of the real part and the imaginary part of the impedance are reduced (lowered) by providing the capacitive structure 126. Specifically, it has been determined that the impedance of the shunt path 130 can be reduced to 1Ω or less in a frequency band (frequency range) of at least 10 MHz and not more than 10 GHz. In addition, it has been determined that the impedance of the shunt path 130 can be controlled by changing the thickness of the base of the package substrate 112 constituting the capacitive structure 126.

Figure 10A:
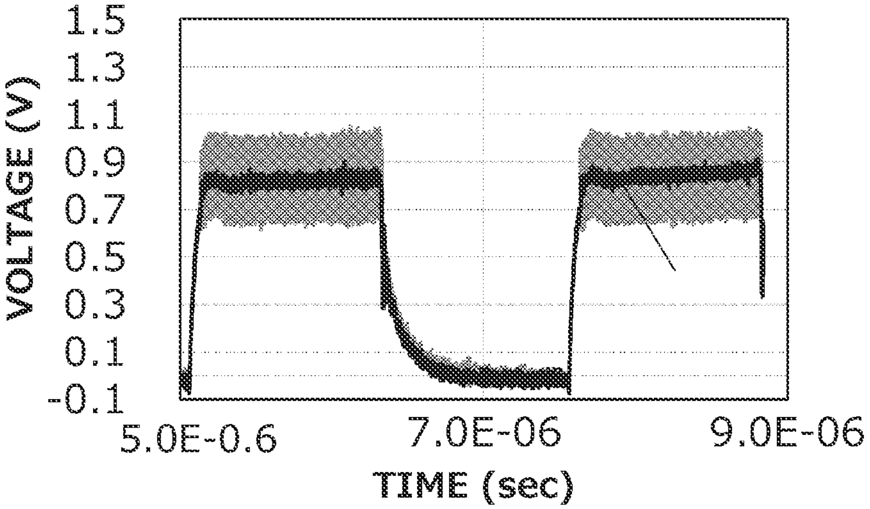
FIGS. 10A and 10B are graphs each showing a measurement result of parasitic oscillation of the high-frequency circuit device according to the second embodiment.
Figure 10B:
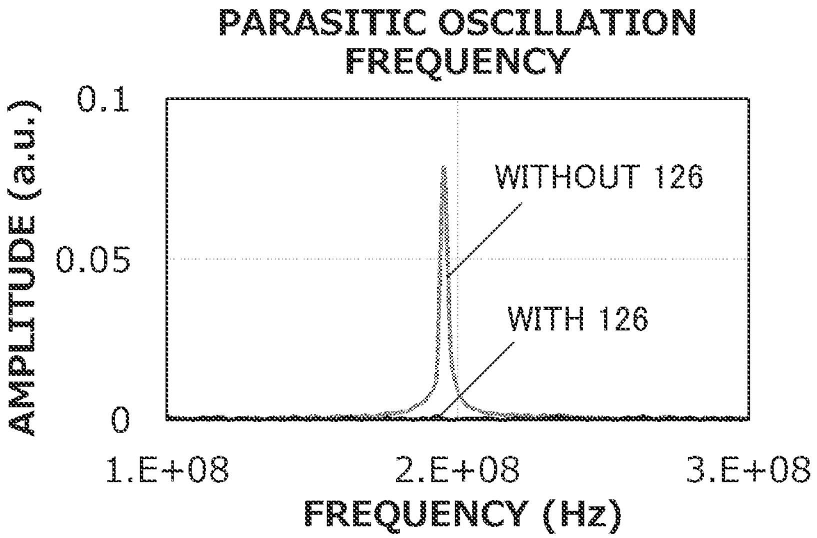

FIGS. 10A and 10B are graphs showing measurement results of the parasitic oscillation for determining the effect of the capacitive structure 126. FIG. 10A shows a temporal waveform and, in FIG. 10A, the horizontal axis indicates time, and the vertical axis indicates voltage. FIG. 10B shows a frequency characteristic and, in FIG. 10B, the horizontal axis indicates frequency, and the vertical axis indicates amplitude. In FIGS. 10A and 10B, a result in the case where the capacitive structure 126 is present and a result in the case where the capacitive structure 126 is not present are compared. According to FIGS. 10A and 10B, in the case where the capacitive structure 126 is not present, while the parasitic oscillation at about 200 MHz is observed, it can be seen that this parasitic oscillation is suppressed by adding the capacitive structure 126.

Figure 11A:
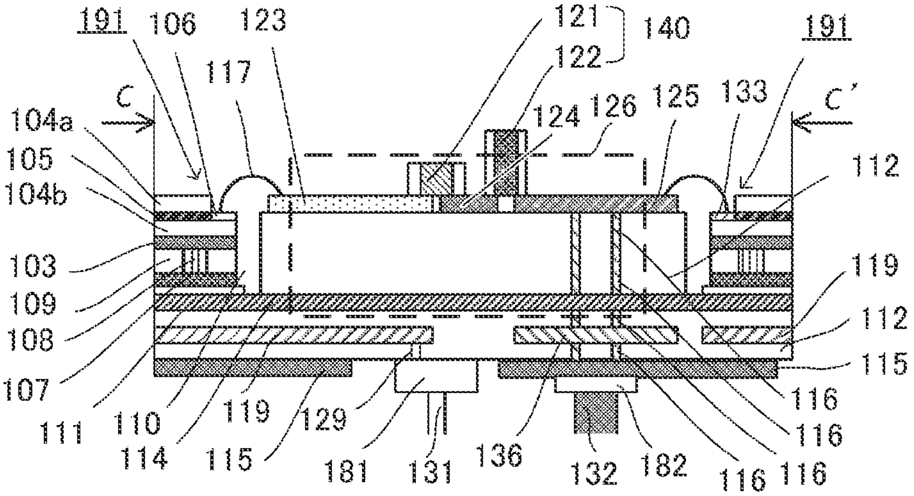
FIGS. 11A to 11C are cross-sectional views of the high-frequency circuit device according to a modification of the second embodiment.
Figure 11B:
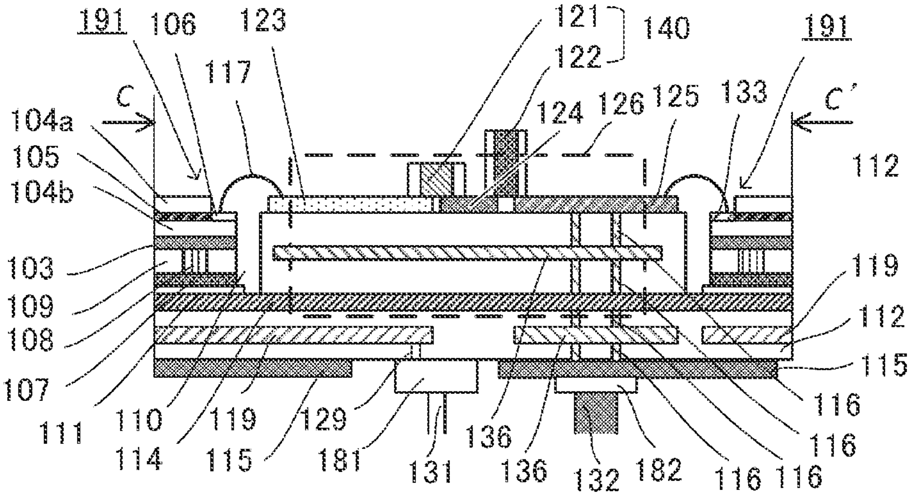
Figure 11C:
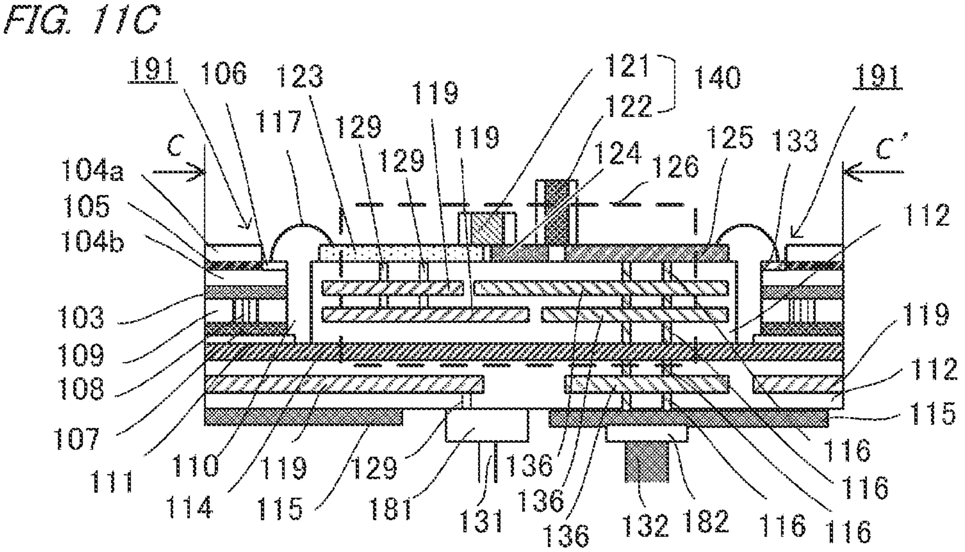

The capacitive structure 126 of the present embodiment is not limited to the structure which has been described thus far. FIGS. 11A to 11C are cross-sectional views taken along the line C-C' of FIG. 5A of a modification of the present embodiment. For example, as shown in FIG. 11A, the capacitive structure 126 does not need to have inner layer wiring such as the package inner layer signal pattern 119 and the package inner layer ground 136 provided above the package second ground 114. In addition, as shown in FIG. 11B, in the capacitive structure 126, a part of the package inner layer ground 136 and a part of the package signal pattern 123 are disposed so as to overlap each other when viewed from the side of the package signal pattern 123, whereby it is possible to adjust the capacitance of the capacitive structure 126. Further, as shown in FIG. 11C, in the capacitive structure 126, inner layer wiring may be disposed in a plurality of layers above the package second ground 114.

Third Embodiment

The high-frequency circuit device according to a third embodiment will be described by using FIG. 12 and FIGS. 13A to 13C. Note that the description of portions which are common to the above description will be omitted. The present embodiment is a modification of the embodiments which have been described thus far.

Figure 12:
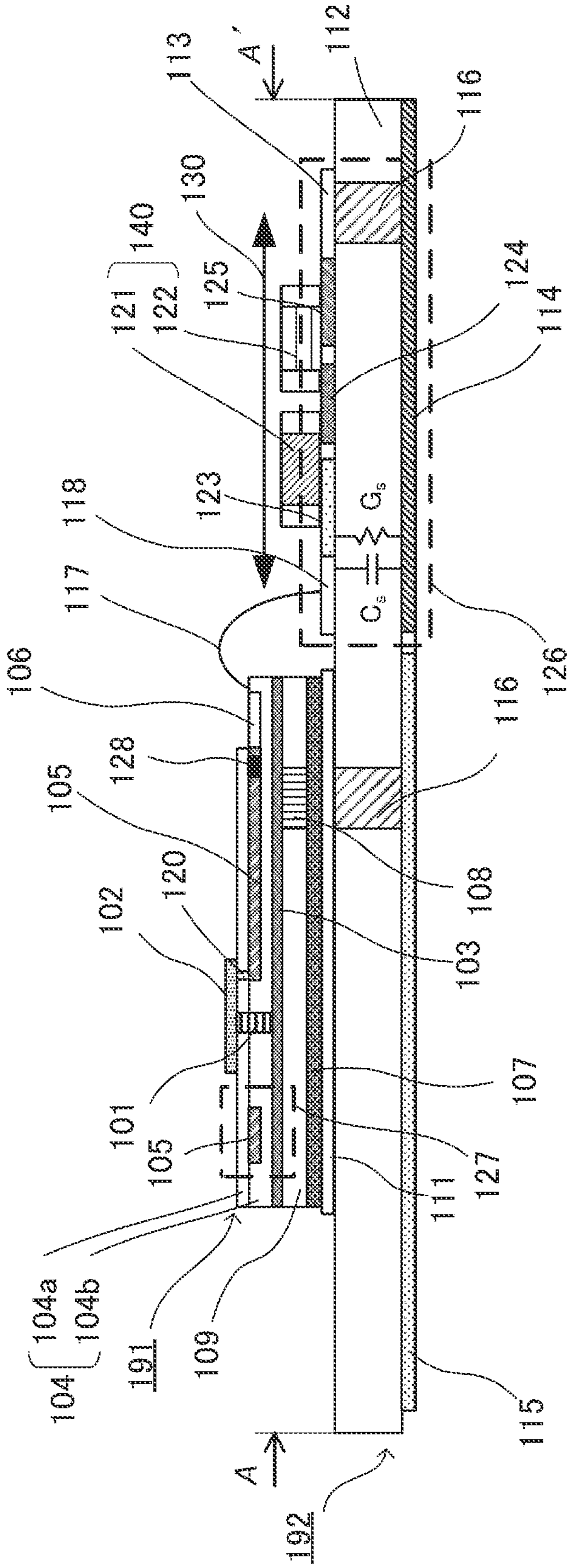
FIG. 12 is a cross-sectional view of the high-frequency circuit device according to a third embodiment.

FIG. 12 is a cross-sectional view taken along the line A-A' of FIG. 1A of the present embodiment. While the chip 191 described above is disposed inside the cavity 110 provided in the package 192, in the present embodiment, the cavity 110 is not used and the chip 191 is mounted on a surface of the package 192 on which the shunt element 140 is mounted.

Figure 13A:
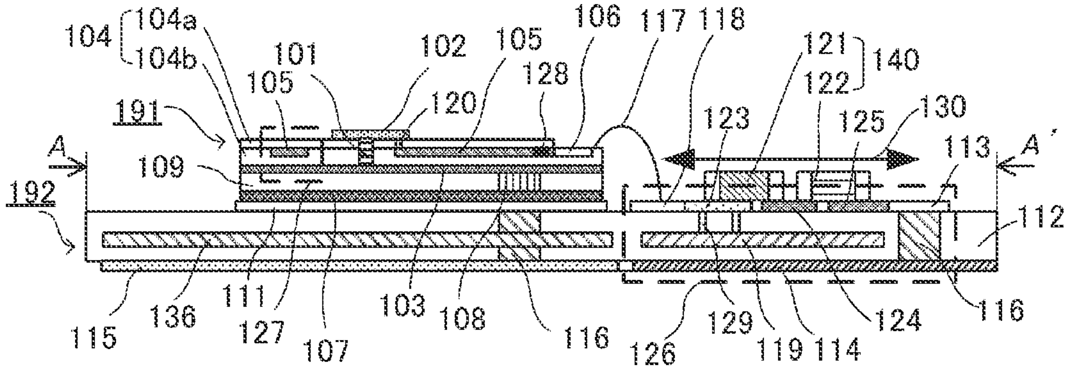
FIGS. 13A to 13C are cross-sectional views of the high-frequency circuit device according to a modification of the third embodiment.
Figure 13B:
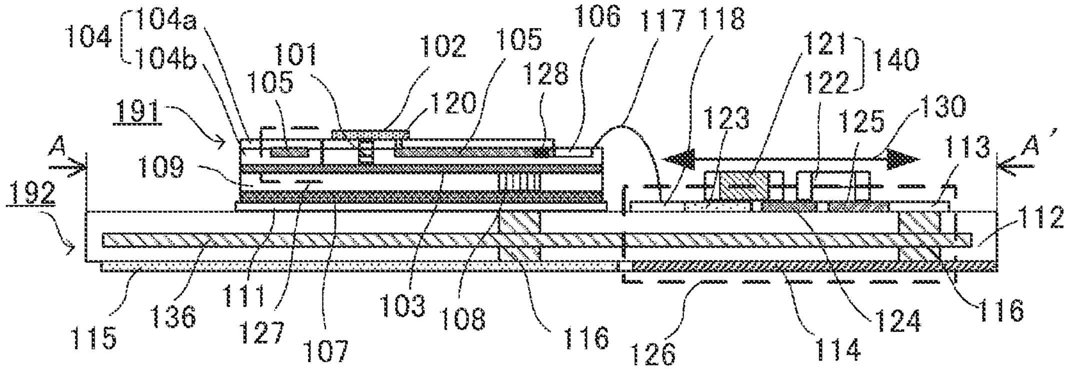
Figure 13C:
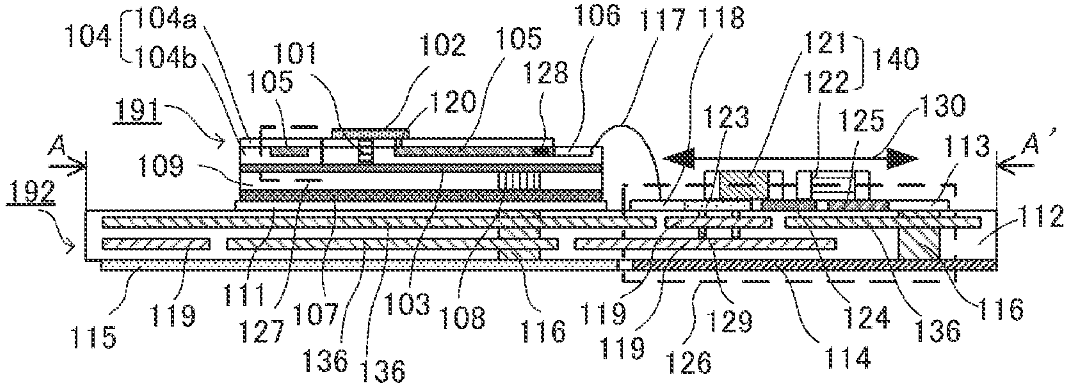

The configuration of the present embodiment is not limited thereto. For example, as shown in FIG. 13A, the package 192 may have the inner layer wiring such as the package inner layer ground 136 and the package inner layer signal pattern 119 which have been described thus far. In addition, as shown in FIG. 13B, it is possible to adopt a configuration in which the capacitance of the capacitive structure 126 is adjusted by the package signal pattern 123 and the package inner layer ground 136. Further, as shown in FIG. 13C, the inner layer wiring may be provided in a plurality of layers in the thickness direction of the package substrate 112.

Fourth Embodiment

Figure 14A:
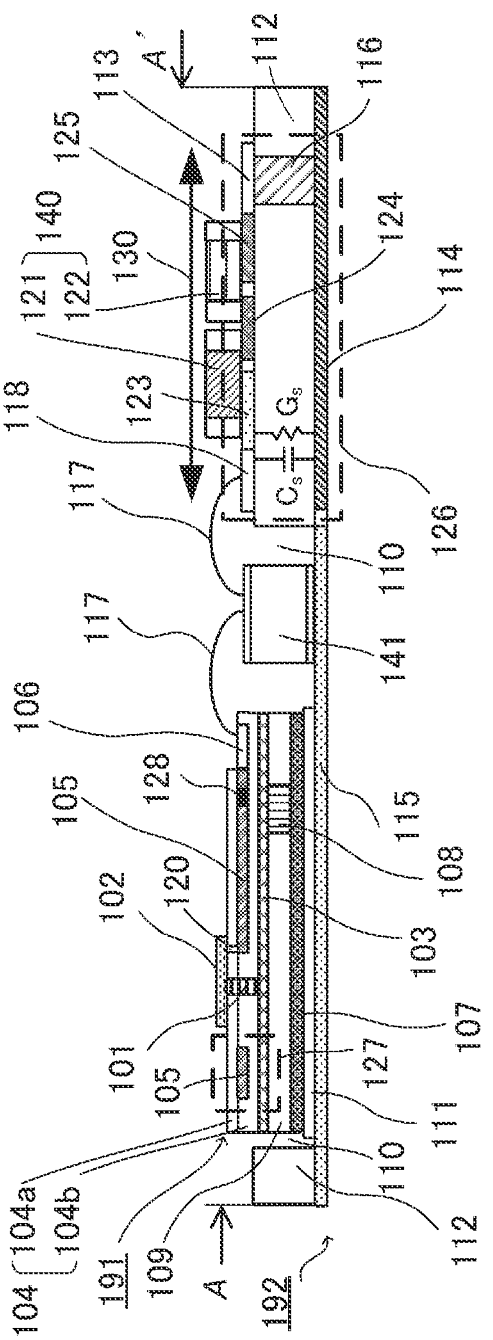
FIGS. 14A and 14B are cross-sectional views of the high-frequency circuit device according to a fourth embodiment.
Figure 14B:
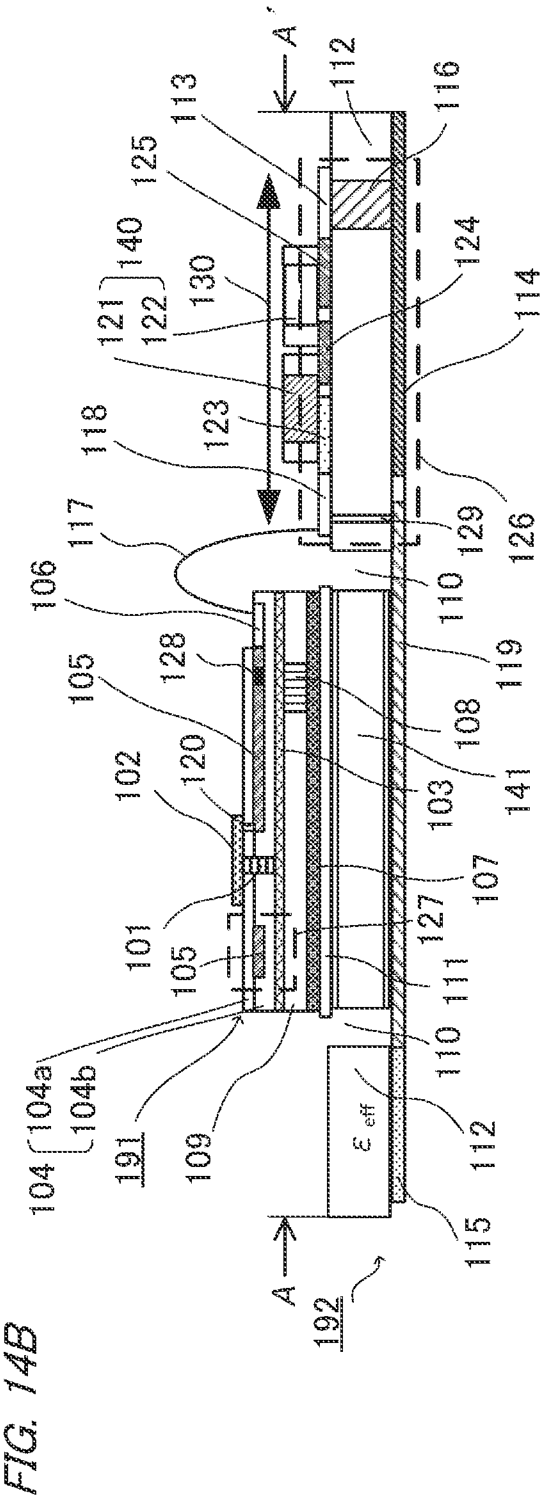

The high-frequency circuit device according to a fourth embodiment will be described by using FIGS. 14A and 14B. Note that the description of portions which are common to the above description will be omitted. The present embodiment is a modification of the embodiments which have been described thus far. As shown in FIGS. 14A and 14B, the present embodiment is different from the embodiments which have been described thus far in that, in a part of an area from the chip 191 to the shunt path 130, a lumped constant element is disposed in the thickness direction of the package substrate 112. For example, in FIG. 14A, a capacitor serving as a lumped constant element 141 which is positioned lateral to the chip 191 is mounted in the thickness direction. In FIG. 14A, one terminal of the lumped constant element 141 is connected to the package second ground 114, and the other terminal thereof is connected to the chip-side signal pad 106 and the package-side signal pad 118 with the bonding wire 117. In addition, as shown in FIG. 14B, it is also possible to mount the chip 191 in the lumped constant element 141. In FIG. 14B, one terminal of the lumped constant element 141 is connected to the package inner layer signal pattern 119, and the other terminal thereof is connected to the back surface chip ground 107 of the chip 191 via the conductive layer 111. Note that the lumped constant element 141 may also be a lumped constant circuit.

According to the present configuration, it is possible to configure the circuit in the thickness direction of the package substrate 112, and hence it is possible to increase the number of circuits incorporated into the package 192 without changing the size of the package 192. In other words, it becomes easy to increase the integration degree of the circuits. In addition, the dielectric of the capacitive structure 126 has been limited to the dielectric of the base of the package substrate 112 heretofore, but, with the present configuration, it is possible to use a different dielectric material as the capacitive structure 126, and flexibility in circuit adjustment is increased.

Fifth Embodiment

The high-frequency circuit device according to a fifth embodiment will be described by using FIG. 15. Note that the description of portions which are common to the above description will be omitted. The present embodiment is a modification of the embodiments which have been described thus far.

Figure 15:
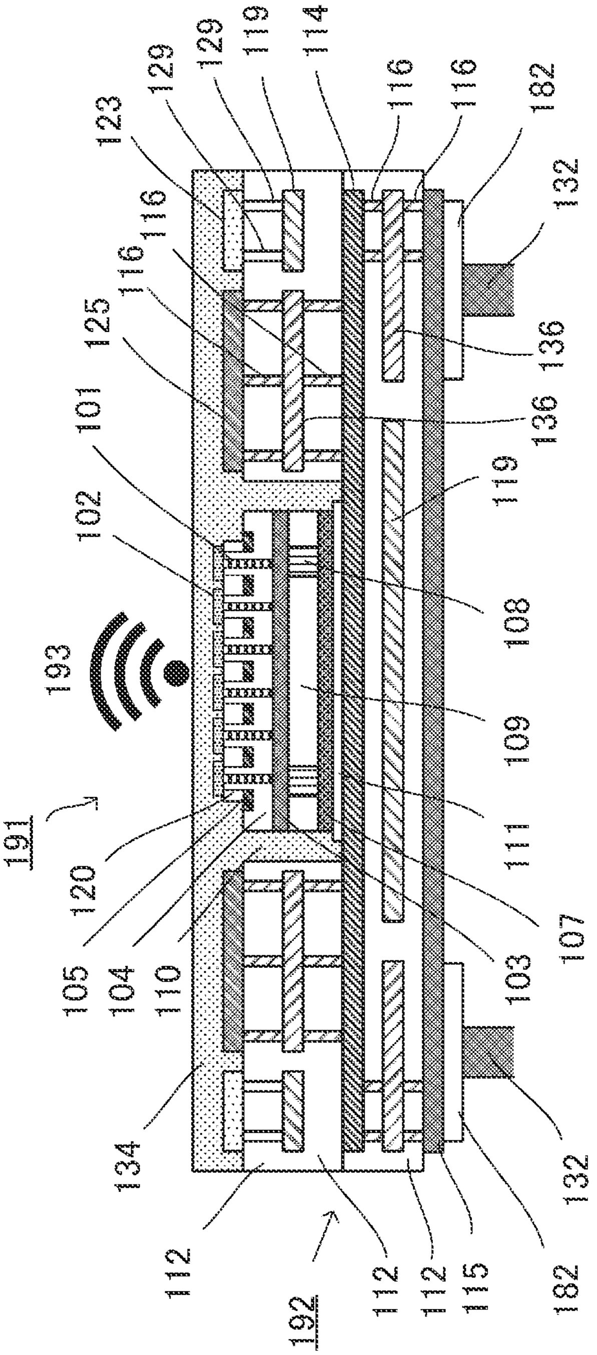
FIG. 15 is a cross-sectional view of the high-frequency circuit device according to a fifth embodiment.

In the present embodiment, as shown in FIG. 15, a sealing layer 134 which seals the upper surface of the chip 191 and a part or whole of the upper surface of the package substrate 112 is further provided. As the sealing layer 134, a transparent resin material having a small loss to the terahertz wave 193 is used. By sealing the surrounding portion of the chip 191 which is a heating element with the sealing layer 134, it is possible to diffuse an amount of heat generated by the chip 191 to a wide area along the sealing layer 134. Consequently, heat dissipation of the chip 191 is improved, and it is possible to prevent thermal destruction of the high-frequency element 101 constituting the chip 191.

Other Embodiments

While the preferred embodiments and the examples of the present invention have been described thus far, the present invention is not limited to the embodiments and the examples, and can be variously modified and changed within the scope of the gist thereof. For example, in the embodiments and the examples described above, the description is made on the assumption that the carrier is an electron, but the carrier is not limited thereto, and a positive hole (hole) may also be used. In addition, the materials of the substrate and the dielectric may be appropriately selected according to uses, and it is possible to use semiconductors of silicon, gallium arsenide, indium arsenide, and gallium phosphide, glass, ceramic, and resins such as polytetrafluoroethylene and polyethylene terephthalate. Note that the structures and the materials described above in the individual embodiments and the individual examples may be appropriately selected according to a desired frequency and the like.

Further, in the embodiments and the examples described above, the square patch antenna is used as the resonator of the terahertz wave. However, the shape of the resonator is not limited thereto, and a resonator having a structure which uses a patch conductor having a polygonal shape such as, e.g., a rectangle or a triangle, a circular shape, or an oblong shape may also be used.

In addition, the number of differential negative resistance elements integrated in the semiconductor element is not limited to one, and the resonator may have a plurality of the differential negative resistance elements. The number of lines is not limited to one, and a configuration in which a plurality of the lines are provided may also be adopted.

Further, in the above description, as the RTD, the description has been given of the double barrier RTD made of InGaAs/AlAs grown on the InP substrate. However, the RTD is not limited to these structures and materials, and combinations of other structures and materials may also be used. For example, the RTD having a triple barrier quantum well structure or the RTD having a multiple barrier quantum well structure having four or more barriers may also be used.

In addition, as the material of the RTD, each of the following combinations may be used.

GaAs/AlGaAs/and GaAs/AlAs, and InGaAs/GaAs/AlAs formed on a GaAs sub strate

InGaAs/InAlAs, InGaAs/AlAs, and InGaAs/AlGaAsSb formed on an InP substrate

InAs/AlAsSb and InAs/AlSb formed on an InAs substrate

SiGe/SiGe formed on an Si substrate

Further, it is possible to use the high-frequency circuit device described in each of the embodiments and the examples described above as a transmitter in a detection system. For example, the detection system uses the high-frequency circuit device as the transmitter, and has a receiver which receives a high frequency from the transmitter and a processing circuit which processes a signal from the receiver. The detection system may also be, e.g., an imaging system which uses the terahertz wave. In addition, in the detection system, the high-frequency circuit device can also be used as the receiver, and the high-frequency circuit device can be used as both of the transmitter and the receiver.

According to the present invention, it is possible to suppress the parasitic oscillation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-209603, filed on Dec. 23, 2021, which is hereby incorporated by reference herein in its entirety.

What is claimed is:

1. A circuit device configured to handle an electromagnetic wave including at least a part of a frequency band from 30 GHz to 30 THz, the circuit device comprising:
- a chip which includes an element configured to operate with the electromagnetic wave, a circuit configured to handle the electromagnetic wave, a signal conductor, and a chip ground; and
- a package substrate which includes a base having an upper surface and a back surface on an opposite side of the upper surface, and on which the chip is disposed,
- wherein the circuit device further comprises:
  - a shunt path which is constituted by a package signal conductor which is disposed on the upper surface of the package substrate and is electrically connected to the signal conductor, a package first ground which is electrically connected to the chip ground, and a shunt element which is electrically connected to the package signal conductor and the package first ground; and
  - a package second ground which is disposed at least inside the base of the package substrate or on the back surface of the package substrate, wherein
  - a part of the base, a part of the shunt path, and the package second ground constitute a capacitive structure, and
- wherein the shunt element includes a resistance element and a capacitive element connected in series between the package signal conductor and the package first ground.

2. The circuit device according to claim 1, wherein a frequency range in which an impedance of the shunt path is made equal to or less than a predetermined value by the capacitive structure is a range of at least 10 MHz and not more than 10 GHz.

3. The circuit device according to claim 2, wherein the impedance of the shunt path is not more than 1 Ω in the range of at least 10 MHz and not more than 10 GHz.

4. The circuit device according to claim 1, further comprising a package ground which is disposed on the back surface of the package substrate.

5. The circuit device according to claim 4, wherein the chip further has a chip ground through conductor and a back surface chip ground, wherein the chip ground through conductor connects the chip ground disposed on an upper surface of the chip and the back surface chip ground disposed on a back surface of the chip, and wherein the back surface chip ground is connected, via a conductive layer, to the package second ground of the package substrate or the package ground of the package substrate.

6. The circuit device according to claim 1, further comprising a package ground through conductor which connects the package first ground and the package second ground, wherein, in a case where an effective wavelength of a signal of the circuit configured to handle the electromagnetic wave is a wavelength $\lambda_{sig}$ and an effective wavelength of parasitic oscillation which occurs in the shunt path is a wavelength $\lambda_{para}$, a distance L between the element and the package ground through conductor satisfies:

$$\lambda_{sig} \leq L \leq \lambda_{para}.$$

7. The circuit device according to claim 1, further comprising a package inner layer signal conductor which is disposed inside the base of the package substrate at a position at which a part of the package inner layer signal conductor overlaps the package signal conductor in a direction perpendicular to the upper surface of the package substrate.

8. The circuit device according to claim 1, wherein a part of the shunt path, a part of the package first ground, and a part of the package second ground are disposed so as to overlap each other in a case where viewed from the shunt path.

9. The circuit device according to claim 1, wherein the package substrate further has a cavity which accommodates the chip, and wherein the back surface chip ground disposed on the back surface of the chip and the package second ground are electrically connected to each other on a bottom surface of the cavity.

10. The circuit device according to claim 1, wherein the signal conductor and the package signal conductor are electrically connected to each other via a wire.

11. The circuit device according to claim 1, wherein a lumped constant element is disposed in a thickness direction of the package substrate in a part of an area from the chip to the shunt path.

12. The circuit device according to claim 1, further comprising a sealing layer which seals the upper surface of the chip and a part or a whole of the upper surface of the package substrate.

13. The circuit device according to claim 1, wherein the chip is disposed on the upper surface of the base.

14. The circuit device according to claim 1, wherein the high frequency element is a negative resistance element, and wherein the high frequency circuit is an antenna which transmits or receives a terahertz the electromagnetic wave.

15. A detection system comprising:

the circuit device according to claim 1 which is used as a transmitter;

a receiver which receives the electromagnetic wave from the transmitter; and a processing circuit which processes a signal from the receiver.

* * * * *